(12) United States Patent
Shi et al.

(10) Patent No.: US 12,155,178 B2
(45) Date of Patent: Nov. 26, 2024

(54) VCSEL WITH DOUBLE OXIDE APERTURES

(71) Applicant: II-VI Delaware, Inc., Wilmington, DE (US)

(72) Inventors: Hanxing Shi, Sunnyvale, CA (US);
Richa Dubey, Sunnyvale, CA (US);
Deepa Gazula, Sunnyvale, CA (US);
Chris Kocot, Sunnyvale, CA (US);
Charles B. Roxlo, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 18/062,123

(22) Filed: Dec. 6, 2022

(65) Prior Publication Data

US 2023/0116197 A1  Apr. 13, 2023

Related U.S. Application Data

(63) Continuation of application No. 16/992,936, filed on Aug. 13, 2020, now Pat. No. 11,552,450.

(60) Provisional application No. 62/886,630, filed on Aug. 14, 2019.

(51) Int. Cl.
| | | |
|---|---|---|
| *H01S 5/183* | (2006.01) | |
| *H01S 5/40* | (2006.01) | |
| *H01S 5/343* | (2006.01) | |

(52) U.S. Cl.
CPC ...... *H01S 5/18313* (2013.01); *H01S 5/18311* (2013.01); *H01S 5/18333* (2013.01); *H01S 5/18344* (2013.01); *H01S 5/18361* (2013.01); *H01S 5/4081* (2013.01); *H01S 5/3432* (2013.01)

(58) Field of Classification Search
CPC ............ H01S 5/18313; H01S 5/18311; H01S 5/18333; H01S 5/18344; H01S 5/18361; H01S 5/4081
See application file for complete search history.

(56) References Cited

U.S. PATENT DOCUMENTS

| 5,881,085 A | 3/1999 | Jewell |
| 11,552,450 B2 * | 1/2023 | Shi ...................... H01S 5/18344 |
| 2007/0153865 A1 | 7/2007 | Maeda et al. |
| 2010/0208764 A1 | 8/2010 | Otoma et al. |
| 2019/0067906 A1 | 2/2019 | Yuen et al. |

* cited by examiner

*Primary Examiner* — Yuanda Zhang
(74) *Attorney, Agent, or Firm* — Blank Rome LLP

(57) ABSTRACT

In one example, a vertical cavity surface emitting laser (VCSEL) may include an active region to produce light at a wavelength, an emission surface to emit the light at the wavelength, a first oxide region spaced apart from the active region by a distance of at least a half-wavelength of the wavelength, a first oxide aperture in the first oxide region, a second oxide region between the first oxide region and the second oxide region, and a second oxide aperture in the second oxide region. The emitted light may have a divergence angle that is based on the respective positions and thicknesses of the first oxide region and the second oxide region.

21 Claims, 20 Drawing Sheets

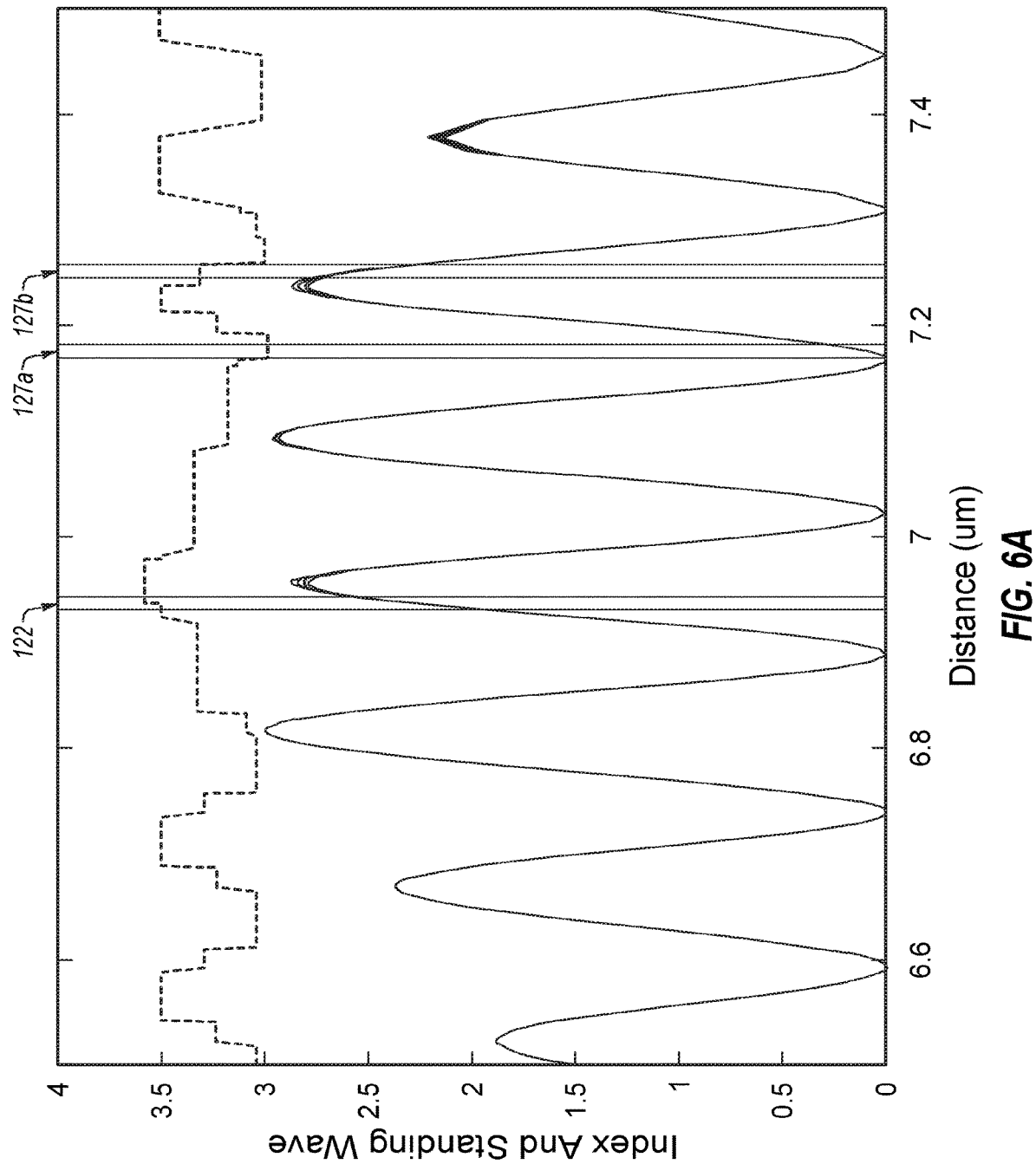

VCSEL WITH DOUBLE OXIDE APERTURES

CROSS-REFERENCE TO RELATED APPLICATIONS

This application is a continuation of Ser. No. 16/992,936, filed Aug. 13, 2020, which claims priority to and the benefit of U.S. Provisional Patent Application No. 62/886,630 filed Aug. 14, 2019, titled VCSEL WITH DOUBLE OXIDE APERTURES, which is incorporated herein by reference in its entirety.

BACKGROUND

Unless otherwise indicated herein, the materials described herein are not prior art to the claims in the present application and are not admitted to be prior art by inclusion in this section.

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks, such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks. One type of laser that is used in optical data transmission is a Vertical Cavity Surface Emitting Laser (VCSEL).

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one example embodiment, a vertical cavity surface emitting laser (VCSEL) may include an active region to produce light at a wavelength, an emission surface to emit the light at the wavelength, a first oxide region spaced apart from the active region by a distance of at least a half-wavelength of the wavelength, a first oxide aperture in the first oxide region, a second oxide region between the first oxide region and the second oxide region, and a second oxide aperture in the second oxide region. The emitted light may have a divergence angle that is based on the respective positions and thicknesses of the first oxide region and the second oxide region.

In another example embodiment, a VCSEL may include a first oxide aperture in a first oxidized region that is positioned between an active region and an emission surface, a second oxide aperture in a second oxidized region, and a non-oxidized epitaxial region between the first oxide region and the second oxide region. In some aspects, the combination of the first oxide aperture and second oxide aperture diverge an emitted laser beam to have a numerical aperture between about 0.14 and about 0.31.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features will become more fully apparent from the following description and appended claims, or may be learned by the practice as set forth herein.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 6A includes a graph showing the index of refraction and standing wave versus distance for a VCSEL having a first oxide region at the second node and a second oxide region at the second antinode.

DETAILED DESCRIPTION

Figure 1:
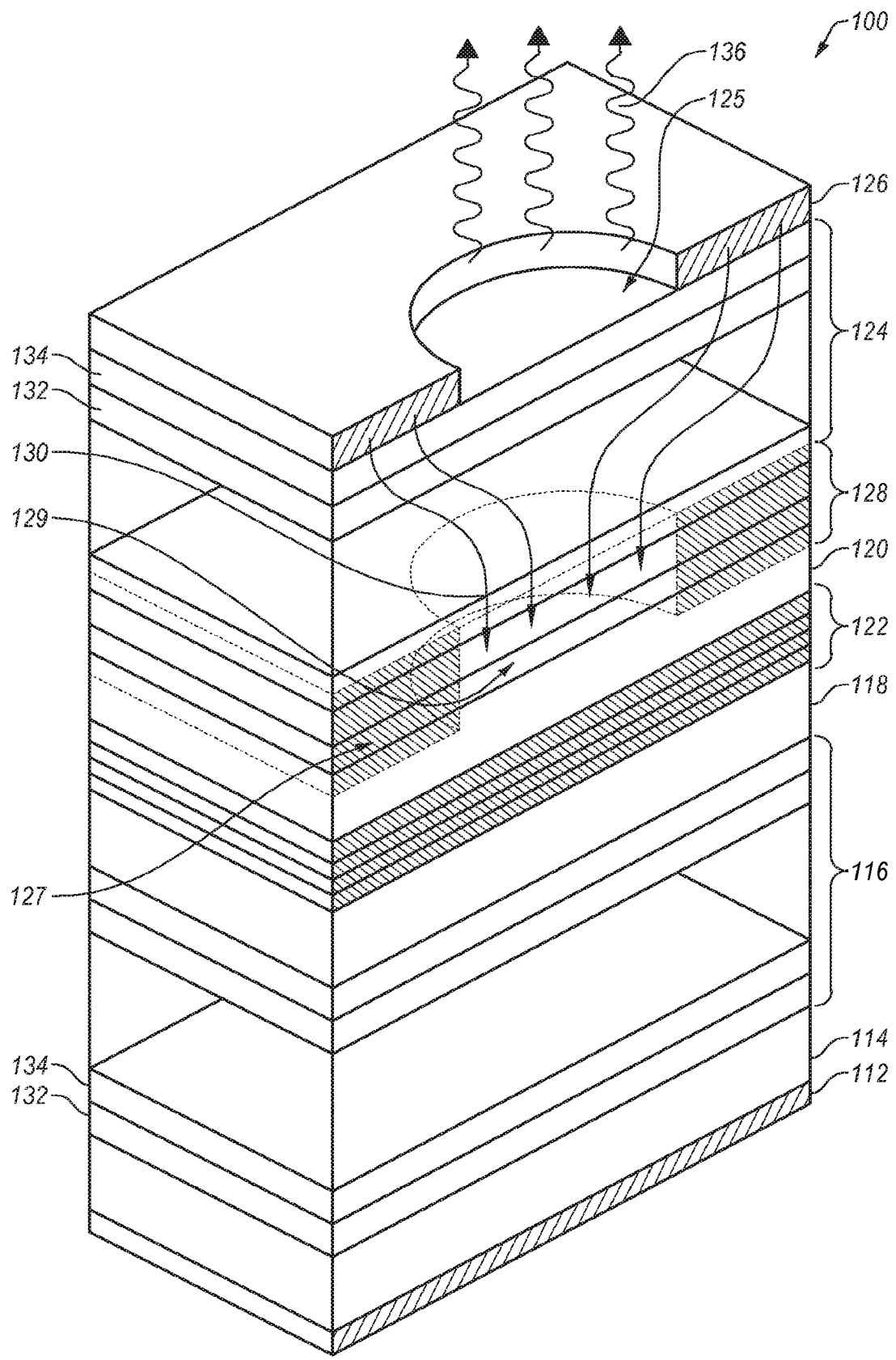
FIG. 1 is a schematic of an embodiment of a VCSEL operating environment having a single oxide region having an oxide aperture.

A VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons to recombine with holes in the conduction band to the valance band which produces additional photons. When the optical gain exceeds the total loss in the two mirrors, laser oscillation occurs.

The active region may also include an oxide aperture formed by an oxide layer formed in the top or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the mirror nearer to the emission surface has fewer mirror periods of alternating high index and low index of refraction layers compared to the mirror nearer to the non-emitting end, to enhance light emission from the emission surface of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

Generally, the present advancement in VCSEL technology relates to having a double oxide region configuration that has a first oxidized region having a first oxide aperture at the second node of the standing wave and a second oxidized region having a second oxide aperture that is spaced apart from the first oxide region. That is, there are two oxidized regions spaced apart from each other, and each has an aperture with a cross-sectional shape, and thereby is referred to a double oxide VCSEL. Two regions of the epitaxial structure are oxidized, and referred to as oxide regions or oxidized regions. The oxidized regions may also be referred to as layers, but the regions may include one or more distinct layers that are oxidized. The oxidized regions and oxide apertures are used as common in VCSELs. However, it has been found that the identified characteristics of location, thickness and separation of each of the oxide regions in the double oxide regions can be modulated and tailored to obtain a desired optical beam property, such as divergence angle or numerical aperture of the optical beam that is emitted therefrom. This allows for tailoring the divergence angle or numerical aperture without a diffuser; however, a diffuser may still be employed for further diverging to have a numerical aperture greater than the about 0.31 for beam divergence obtained by the first oxide aperture at the second node and the second oxide aperture at the antinode (e.g., second antinode). As used herein, an oxide aperture refers to an aperture in an oxide region, where the aperture itself is not oxidized. Instead, the aperture is surrounded by the oxide formed by the oxidation of the semiconductor material.

The double oxide apertures can provide surprising and unexpected results as described herein, such as tuning the divergence angle or numerical aperture to a desired divergence angle or numerical aperture by determining the spacing between the first and second oxidized regions and placement thereof relative to the active region or nodes of the standing wave. The placement of the two oxidized regions and varying the thickness of the non-oxidized region between the two oxidized regions can tune the divergence angle or numerical aperture. The double oxidized regions with the defined spacing for the divergence angle or numerical aperture may be formed within a VCSEL by methods that are common in VCSELS, such as between the active region and top mirror at the specific locations and spaced therefrom to get the divergence angle or numerical aperture. Accordingly, each oxidized region around the apertures can provide a blocking region and the double apertures can provide for a continuous conducting region in the aperture region between the first oxide aperture and second oxide aperture.

The double oxide apertures in the double oxide regions can be prepared by various methods. In one example, the lateral oxidation processing is used. In another example, each oxidized layer is formed and the aperture is formed by etching, and then refilling each aperture with a conductive material in two steps to form the spaced apart double oxide apertures.

The oxide apertures can include a material that is more electrically conducting and more optically favorable than the oxidized material of the oxidized regions during operation of the VCSEL and light generation in an active region. Accordingly, each oxidized region and aperture can form a heterojunction for selective current guidance. The apertures can form a conducting channel through the oxidized regions. Planarized layers, such as mirror layers, can be formed over the oxidized regions forming the double oxide apertures. Otherwise, the VCSEL can be prepared as standard in the industry or as in the incorporated references or described herein.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. However, the active region can be configured as any known or developed in the art of VCSELs.

Electrical confining layers can sandwich the active region and provide optical gain efficiency by confining carriers to the active region. The confining layers can have a region of high energy band gap which in many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and can increase the efficiency in the active region. In an exemplary embodiment, the high aluminum region may also include an increase in doping. The confining layer can be doped with a p-type or n-type dopant depending on whether the confinement barrier is on the n-side or p-side of the active region.

FIG. 1 shows a planar, current-guided, VCSEL 100 having an aperture 129 in an oxidized region 128. The VCSEL 100 can include periodic layer pairs for top (124) and bottom (116) mirrors. A substrate 114 is formed on a bottom contact 112 and is doped with a first type of impurities (i.e., p-type or n-type dopant). A bottom mirror stack 116 is formed on substrate 114 and an optional bottom confining layer 118 is formed on the bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. An oxidized region 128 is formed over the active region 122 or over the optional top confining layer 120. The oxidized region 128 includes a lateral oxidized region 127 and a central aperture 129. The bottom confining layer 118 and/or top confining layer 120 may be a spacer region between the active region and isolation region. Alternatively, the bottom confining layer 118 and/or top confining layer 120 may be a conducting region. Thus, any spacer region bounding the active region may be a confining region, conducting region, or semiconductor spacer that is not confining or conducting.

An upper mirror stack 124 is formed over the oxidized region 128. A metal layer 126 forms a contact on a portion of stack 124, and the metal layer 126 includes an optical aperture 125, which may be circular as shown, but may also be elliptical or another shape. However, other VCSEL configurations may also be utilized, and various other VCSEL layers or types of layers can be used; however, the resulting VCSEL includes an oxidized region having an aperture therethrough.

An oxidized region 128 restricts an area of a current flow 130 through the active region 122. Oxidized region 128 can be formed to include the lateral oxidized region 127 and the aperture 129 by any possible method. Mirror stacks 116 (bottom) and 124 (top) can be distributed Bragg reflector (DBR) stacks, and include periodic layers (e.g., 132 and 134, but may be switched from what is shown). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124 and out of the optical aperture 125. Those skilled in the art will recognize that other configurations of contacts can be used to generate a voltage across active region 122 and generate light 136.

Now, a VCSEL can be prepared that includes two distinct oxide regions that are both between the active region 122 and the metal contact layer 126. While an oxidized region 128 is shown, the location of each oxidized region can be varied in order to obtain a desired optical beam property, such as a divergence angle of the emitted beam. Thus, FIG. 1 can be modified by optionally moving the oxidized region 128 and then adding a second oxidized region between the active region 122 and the contact layer 126. For example, the second oxidized region can be at a location within the mirror stack 124.

Figure 2A:
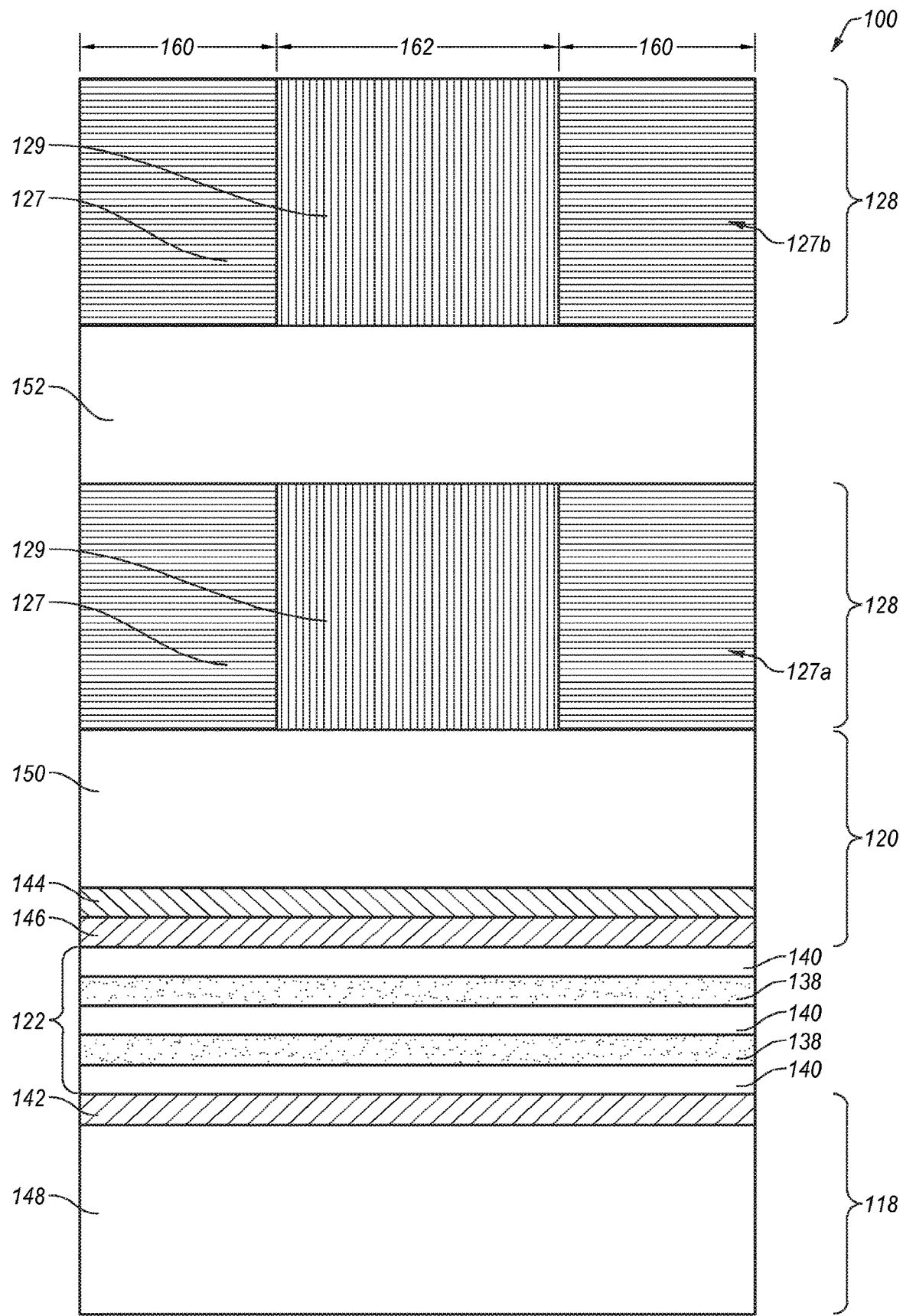
FIG. 2A is a schematic of an embodiment of a VCSEL operating environment having two oxide regions that each have an oxide aperture.

FIG. 2A illustrates the active region 122 and confining layers 118 and 120 under the double oxidized regions 128, each oxidized region having the lateral oxidized region 127a, 127b and non-oxidized aperture 129 (e.g., referred to as the oxide aperture as the aperture is defined by the oxidized material. The two oxidized regions 128 being separated by a spacing region 152, which can be any type of epitaxial region of semiconductor materials in one or more layers in order to space the two oxide regions 128 by a suitable distance to obtain the desired divergence angle or numerical aperture (e.g., mirror region, confining region, or any other region of a VCSEL between the active region 122 and emitting surface). The lateral oxidized regions 127 form the outer current blocking regions 160, and the aperture 129 (non-oxidized) forms the central mode confinement region 162.

Active region 122 is formed from one or more quantum wells 138 that are separated by quantum well barriers 140, where the optional transition layers may be the lines between the quantum wells 138 and barriers 140. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. The combination of high aluminum content region 144 and the ramp region 146 provide an injection structure with good carrier confinement and good electron injection.

Depending on the design of the VCSEL device and the thickness of high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, the spacer layers provide resonant spacing between mirrors and provide that the quantum wells of the active region are centered on a peak of the optical field if desired.

The confining layers 118 and 120 and active region 122 can be formed from one or more types of suitable semiconductor materials. Also, prior to oxidation to form the oxidized region 128, the original semiconductor layers (129) may be these same semiconductor materials, which are then oxidized. As such, the material in the aperture 129 may also include these same semiconductor materials. In one example, the lower electrical confining layer is AlInP. In another example, the upper electrical confining layer can be AlInGaP.

In an example embodiment, one of the oxidized regions 127 is at a node of the standing wave (e.g., second node, third node, etc., counted as extending away from the active region 122), and thereby the VCSEL is designed to accommodate the placement of the first oxidizing region 127*a*. The second oxidized region 127*b* can be spaced apart from the first oxidized region 127*a* and placed apart from the standing node at a location that may be at a node or preferably is not a node for the standing wave.

In one example, only one node (e.g., second node) includes an oxidized region 127 at the node, all other nodes are devoid of an oxidized region. The second oxidized region 127*b* can be at an antinode or middle point between the node and antinode or anywhere between the middle point and the antinode. In some aspects, neither the first oxidized region 127*a* nor the second oxidized region 127*b* is at a node of the standing wave of the VCSEL. In some aspects, both oxidized regions 127 are at nodes, but omitted from the first node. In some aspects, when there is an oxidized region 127 at a second node, then other nodes do not have an oxidized region 127.

Figure 2C:
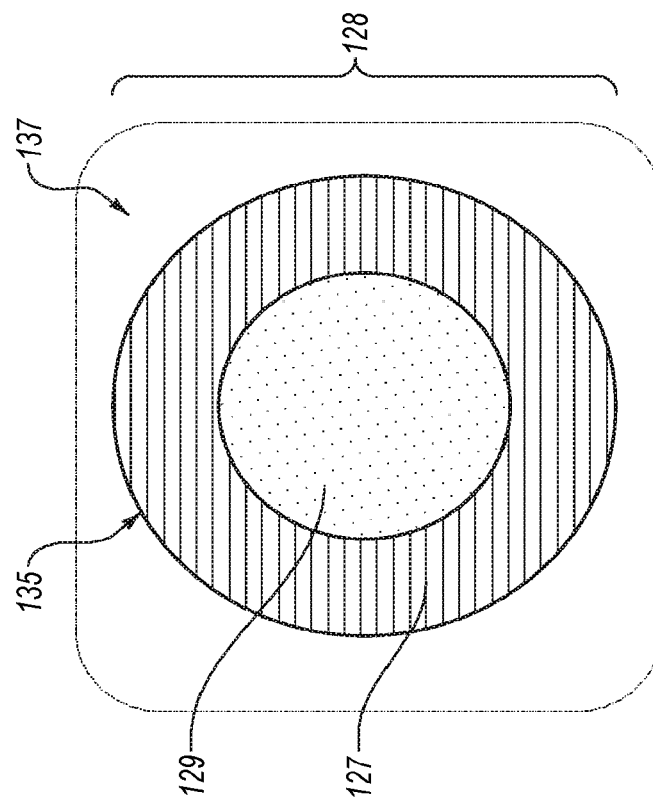
FIG. 2C is a top view of an embodiment of a VCSEL having the two oxide regions that each have an oxide aperture.
Figure 2B:
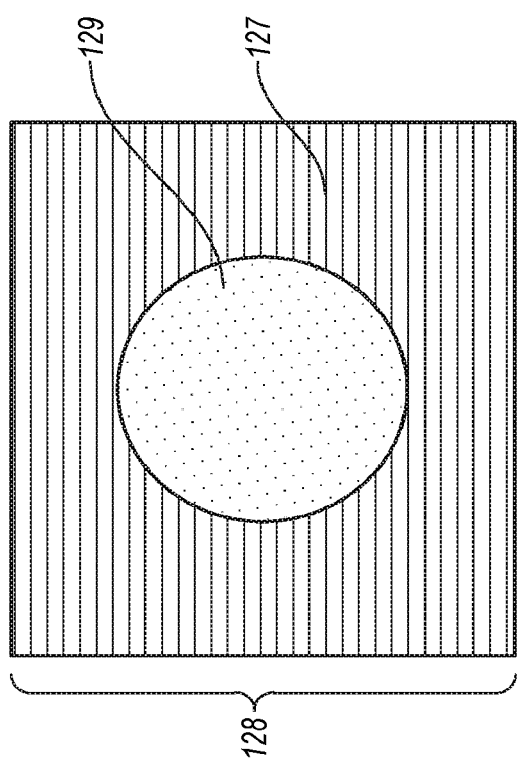
FIG. 2B is a top view of an embodiment of a VCSEL having the two oxide regions that each have an oxide aperture.

FIG. 2B shows a top view with a cross-section of an oxidized region 128 having the lateral oxidized regions 127 and the apertures 129. This may be a portion of a chip having an array of VCSELs or a single VCSEL. FIG. 2C shows a top view with a cross-section of a mesa 135 with shoulders 137. The mesa may include the oxidized regions 128 having the lateral oxidized regions 127 and the apertures 129 A single chip may have a plurality of VCSELS 100, each having an oxidized region 128 either planar as in FIG. 2B or etched to have a plurality of mesas as in FIG. 2C on a single chip.

It has been found that the locations of the first oxide region and second oxide region can be advantageously placed in specific locations in order to obtain desirable laser beam characteristics, such as beam divergence, number of modes, numerical aperture (NA), and radius at beam waist (W0). Previously, beam divergence has not been desirable in VCSELs or other lasers, however, the advancements of using lasers in structured light systems and in 3D sensing obtain benefits from accurately diverging optical beams. Now, the oxidized regions can be positioned to obtain a desired divergence angle of the emitted laser beam or the numerical aperture. Once a desired divergence angle is determined, the VCSEL can be designed and prepared to have the oxidized regions in a position to provide the desired divergence angle and numerical aperture (NA). That is, different oxidized region positions can obtain different divergence angles or numerical apertures. This allows for tailoring the divergence angle or numerical aperture by VCSEL design. Also, the placement of the oxidized region can change the beam property, such as from a single mode beam property to a higher order mode beam property with multiple modes. In some aspects, varying placement of both the first oxidized region 127*a* and the second oxidized region 127*b* at positions other than a node, where one is at a node or neither is at a node, may also be used to modulate the beam divergence and changes from single order modes to multi-modes. However, both oxidized regions can be at nodes (e.g., at the second and third nodes) when none are at the first node.

In some embodiments, the VCSELs can include small apertures, such as 5 microns, and may have an array of VCSELs on a single chip. However, the small aperture can cause a single mode with a small numerical aperture, which may cause strong optical power density and eye safety issues. However, many new applications may be advantageously utilized with multiple modes and a higher numerical aperture (NA) to improve performance. Now, the double oxide regions can provide multiple modes as well as higher NA and improved performance. The double oxide regions configuration can provide for improved power and performance, and may have a small NA and high reliability.

In some embodiments, the two oxide regions can have a thickness that is the same or less than other embodiments with only a single oxide. That is, the two oxides combined have a total thickness that is about the same thickness as a single oxide region, or the total thickness may be thinner than a single oxide region configuration. In some aspects, one or both oxidized regions can have a thickness that is at least about 150 Angstroms (A) to about 300 A for each oxidized regions, or at least about 175 A to about 250 A for each oxidized regions, or at least about 200 A to about 225 A for each oxidized regions. The thickness of each oxide region may also be modulated to change the beam profile characteristics.

Figure 3A:
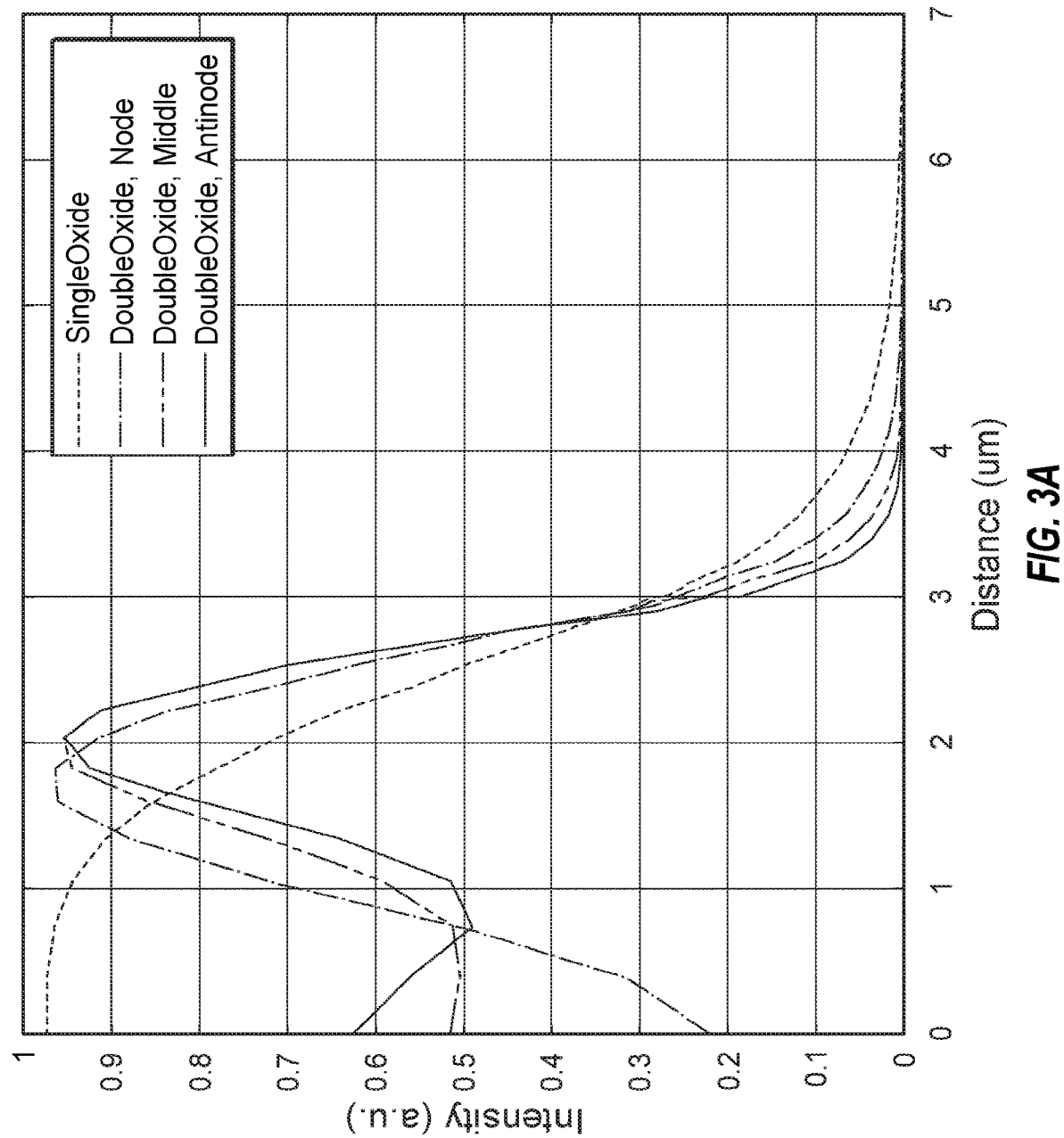
FIG. 3A includes a graph that shows near field data for the intensity versus distance for different VCSEL embodiments having a double oxide region structure.
Figure 3B:
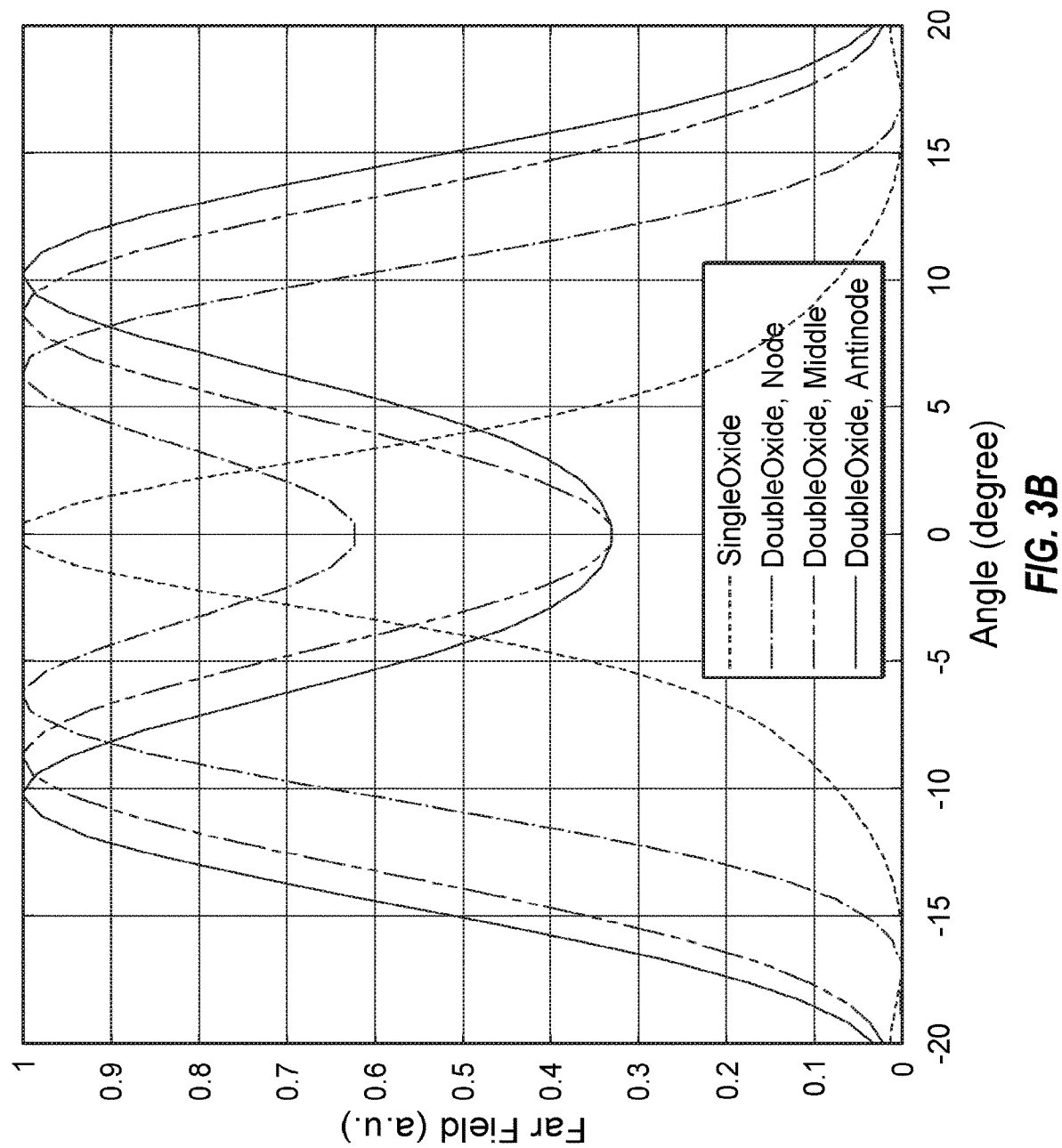
FIG. 3B includes a graph that shows the far field versus angle for different VCSEL embodiments having a double oxide region structure.

FIG. 3A shows the near field versus the distance for a single oxide region (at the second node), double oxide region (first oxide region at second node and second oxide region at the third node), double oxide region (first oxide region at second node and second oxide region at the middle between the third node and second antinode), and double oxide region (first oxide region at second node and second oxide region at the second antinode). FIG. 3B shows the far field versus divergence angle for the same oxide configurations as FIG. 3A. The oxide regions are all 250 Angstroms (A) thick. The double oxides show multi-modes with the higher order of modes. Both FIGS. 3A and 3B show the significant improvement by moving from a single oxide region to the double oxide regions at two nodes. Then, changing the second oxide region away from the third node to either the middle or the antinode provides an even larger improvement than going from single oxide region to double oxide regions at nodes. As such, while a double oxide region configuration is an improvement over a single oxide region, selective placement of the second oxide region when the first oxide region is at the second node can improve the operation and beam design for the VCSELs. The data shows that double oxide regions provide for the multimode with a higher order of modes in the profile.

In some embodiments, the first oxide region can be outside the active region, such as at the first node outside the active region, which often can be the second node of the standing wave. The second oxide region then is spaced from the first oxide region.

FIG. 3B shows a dip in the middle at 0 degrees, which means the fundamental mode is being suppressed and a higher order mode is provided. This provides more beam divergence for the double oxide regions. When the second oxide region is moved to the middle, which is between the node and antinode, there is further improvement, and the most improvement when the second oxide region is at the antinode and stronger index guiding of the light. As such, moving the second oxide region can change the divergence angle. This allows for determining a desired divergence angle and then selecting the location of the second oxide region to obtain that divergence angle. The numerical aperture (NA) is 0.11 for the single oxide, 0.14 for the double oxide structure having the second oxide region at the third node, 0.23 for the double oxide structure having the second oxide region at the middle between the node and antinode, and 0.30 for the double oxide structure having the second oxide region at the antinode.

Figure 3C:
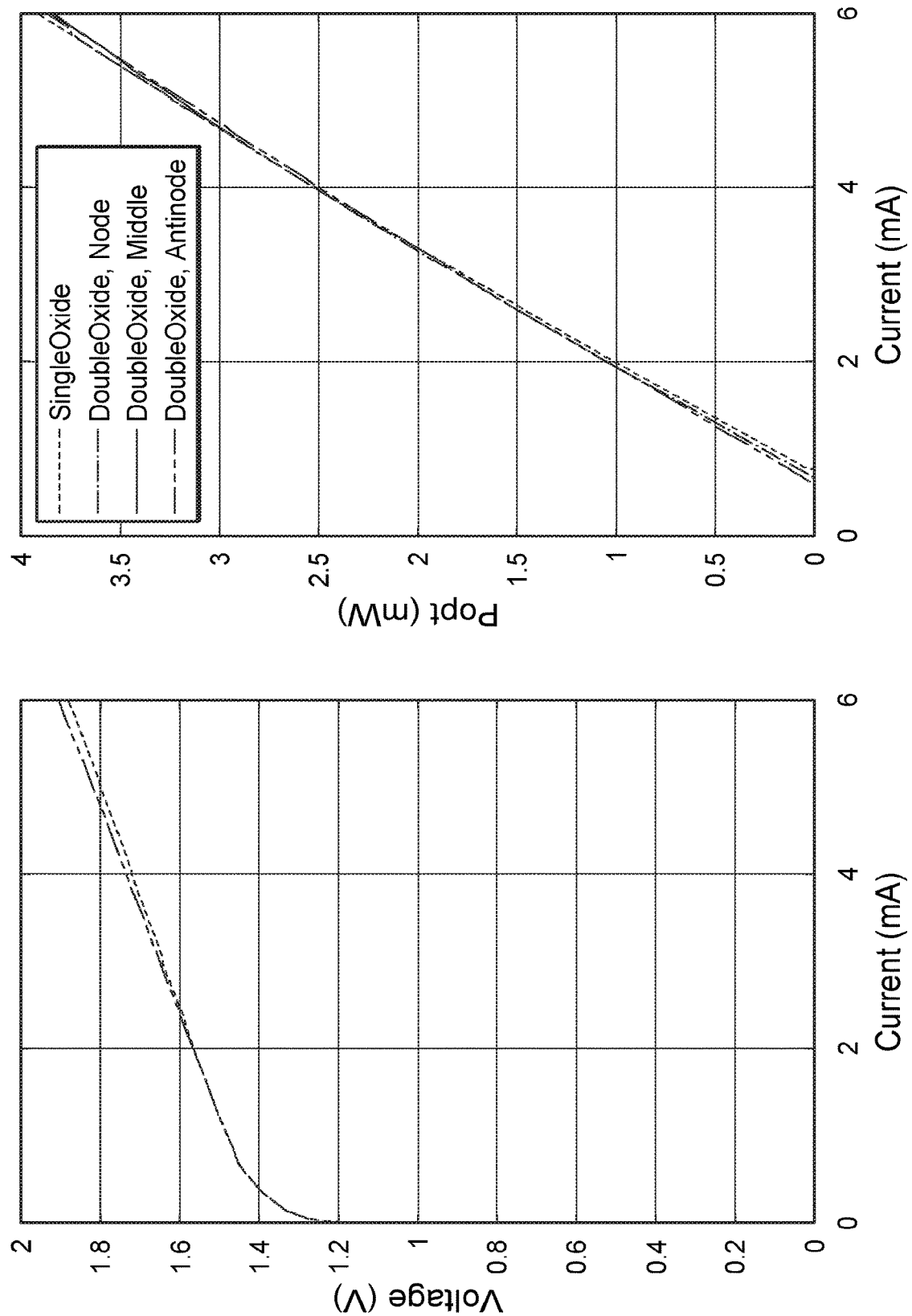
FIG. 3C includes graphs that show voltage (left) and power (right) versus current angle for different VCSEL embodiments having a double oxide region structure.
Figure 3D:
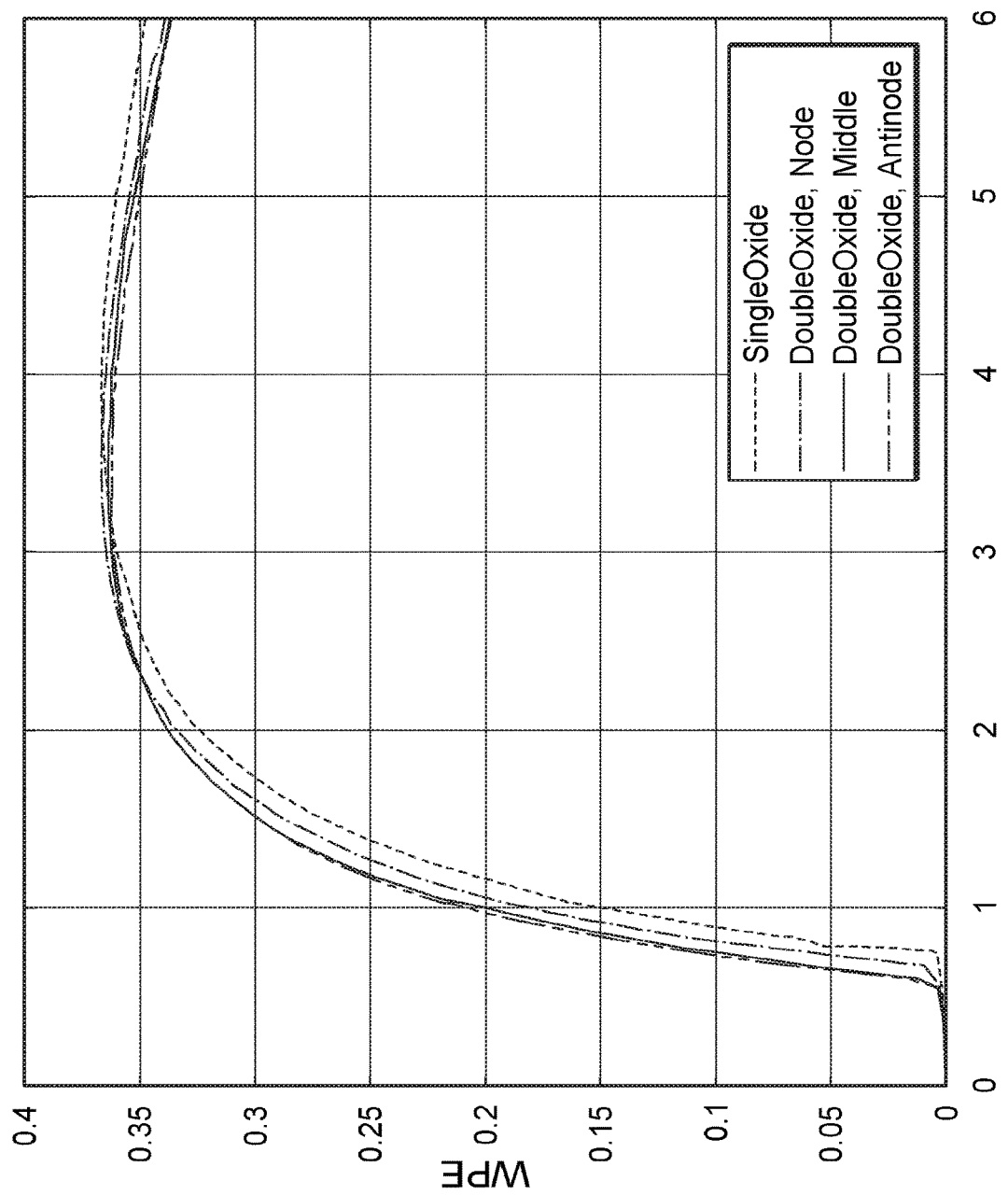
FIG. 3D includes a graph showing the WPE (wall-plug efficiency) versus current for angle for different VCSEL embodiments having a double oxide region structure.

FIG. 3C shows the left graph having voltage versus current, and the right graph having power versus current for the same embodiments as FIGS. 3A-3B. The data of FIG. 3C shows that the different embodiments do not significantly change the voltage or the power. FIG. 3D shows the WPE (wall-plug efficiency, also known as radiant efficiency in energy conversion efficiency) is also not significantly affected by the different embodiments.

In some embodiments, the first oxide region is not at the first node, but is at a different node or at a middle, antinode, or a different middle, node or antinode from the second oxide region. The placement of both oxide regions may be at two different nodes, such as the second and third, second and fourth, third and fourth, and so on and so forth, or at different middle or antinodes of different nodes (e.g., wave locations between nodes). In some instances, no node has an oxide region. In some instances, a node other than the first node has an oxide region. In some instances, both oxide regions are at nodes, whether adjacent nodes or spaced apart nodes. In some instances, the first node is devoid of the oxide regions. The placement of both oxide regions can be selected in order to obtain the desired optical beam profile, such as a divergence angle while retaining power. The different placements and combinations of double oxide region locations can be mapped to beam profiles, such as divergent angles and power, or other. Then the desired beam profile, such as a divergence angle, can be selected, and the placement of both oxide regions can be determined based on the data (e.g., from simulation or real tests). The VCSEL can then be fabricated with the double oxide regions to have the desired beam profile.

In some embodiments, the two oxide regions are in two different materials, and thereby result in two different oxide compositions. The first material that is oxidized is different from the second material that is oxidized, and thereby by the same oxidizing process both of the two oxide regions have different chemical compositions from each other. For example, one oxide region can be in a confining region and the other can be in a mirror period region. This also can result in different oxide aperture sizes in the two different oxide regions. In some aspects, the first aperture of the first oxide region can be smaller than the second aperture of the second oxide region, or vice versa. The different aperture sizes can be tailored to obtain the desired beam divergence angle or numerical aperture.

Figure 5A:
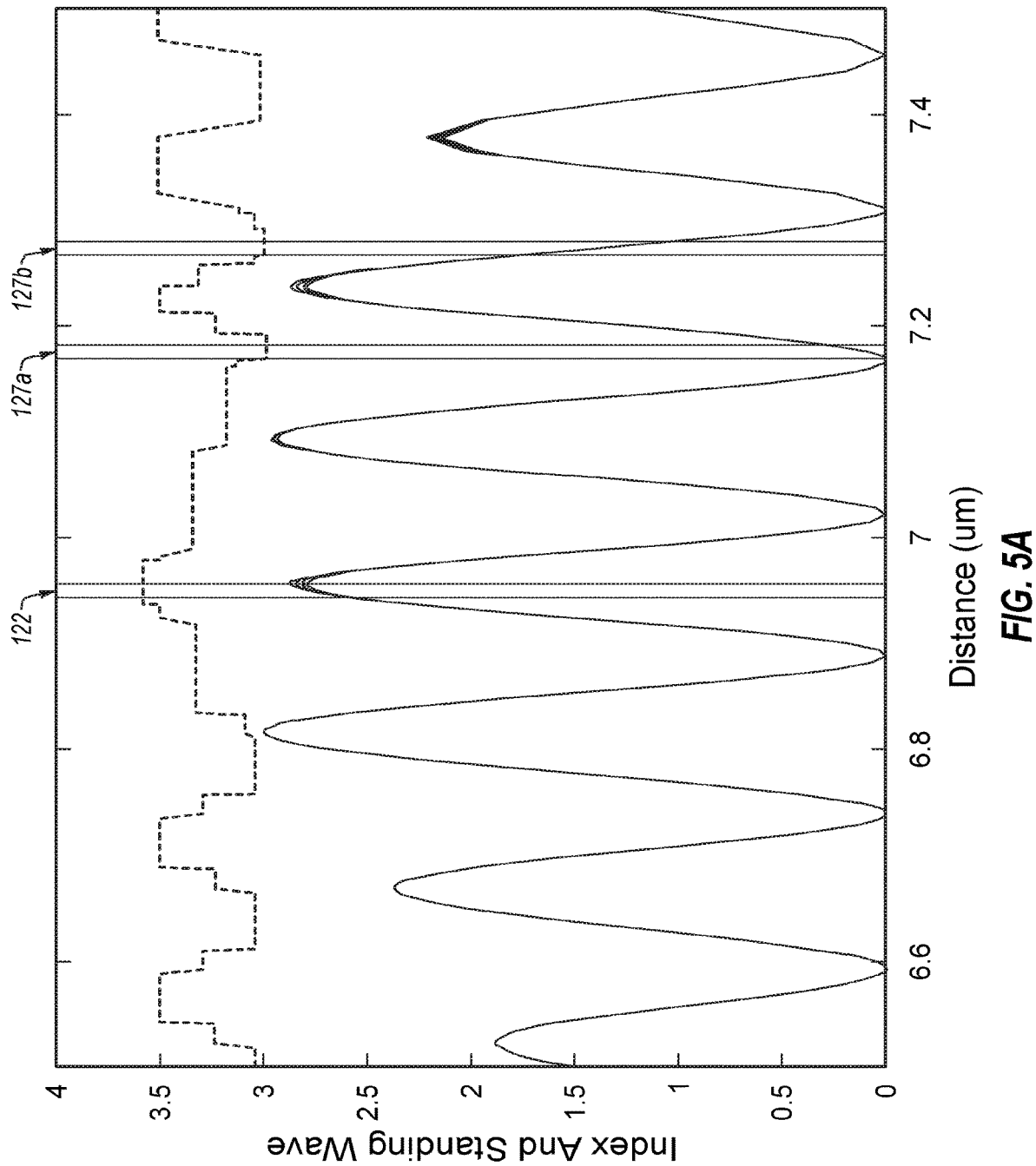
FIG. 5A includes a graph showing the index of refraction and standing wave versus distance for a VCSEL having a first oxide region at the second node and a second oxide region at a middle position between the second antinode and the third node.
Figure 5B:
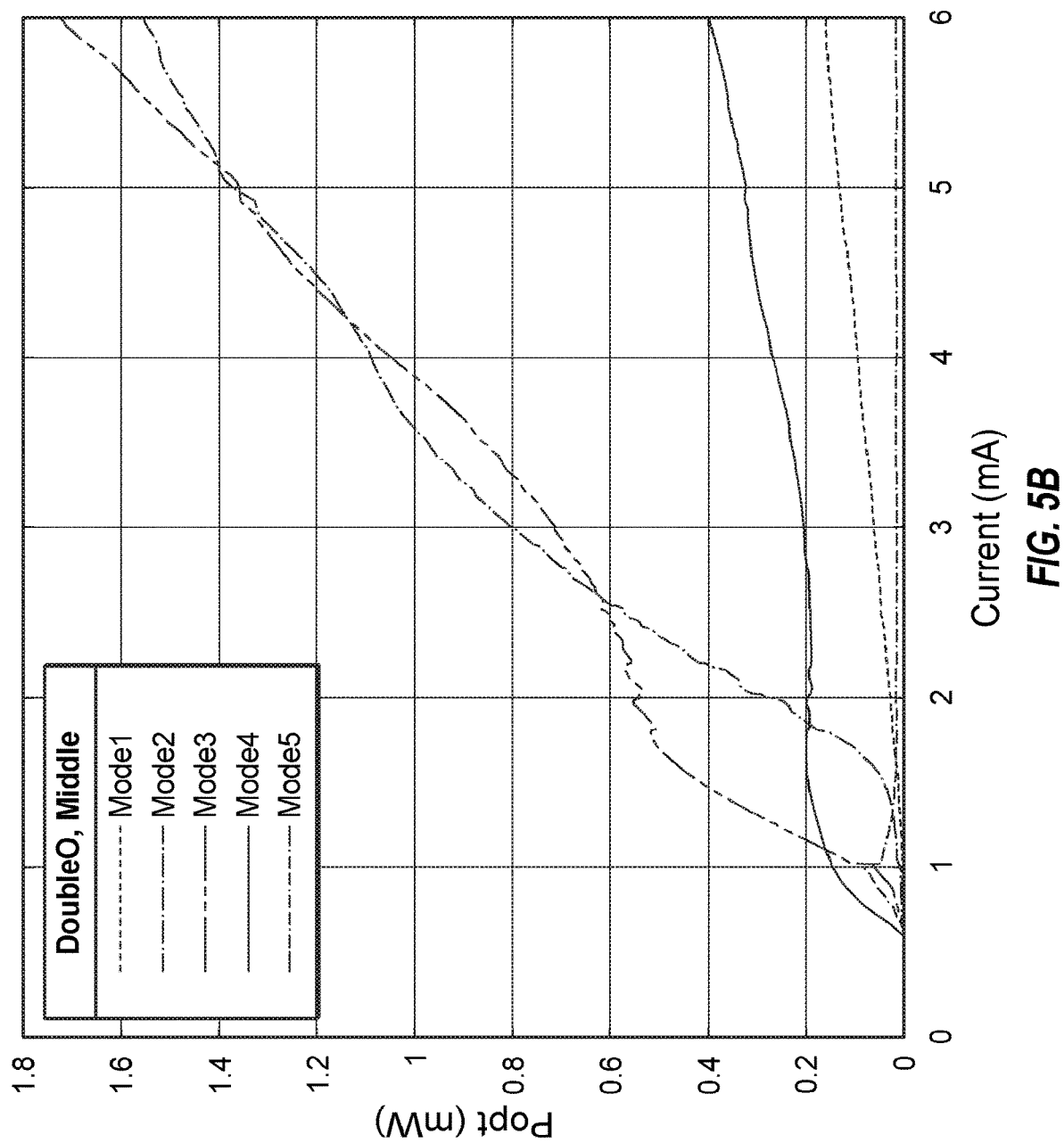
FIG. 5B includes a graph of the power versus current that shows the multi-modes for the VCSEL of FIG. 5A.
Figure 6B:
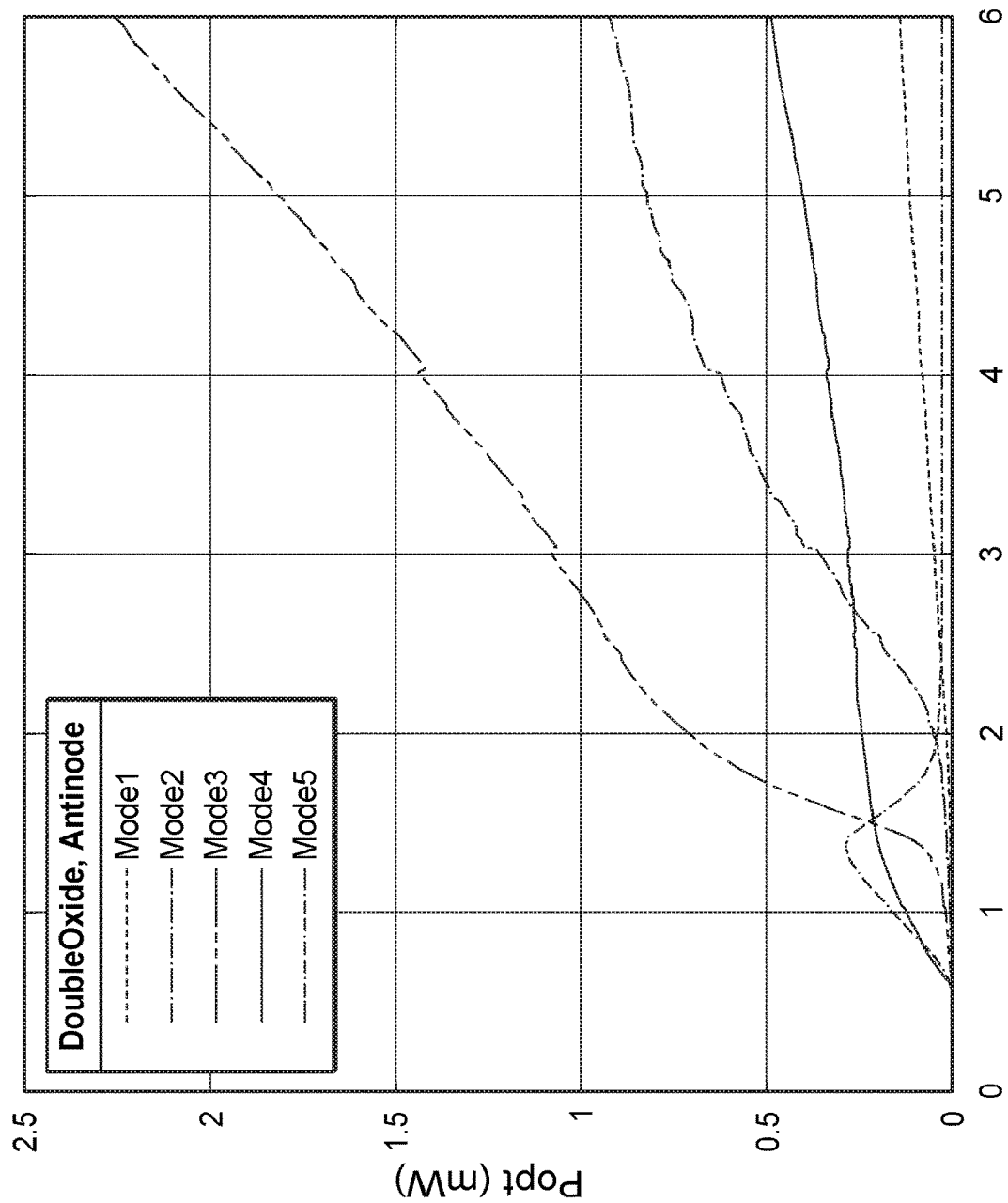
FIG. 6B includes a graph of the power versus current that shows the multi-modes for the VCSEL of FIG. 6A.

The double oxide regions configuration was evaluated with 250 A thick oxide region (e.g., oxidized regions are oxide regions) with the first oxide region placed at the second node and the second oxide region either at the third node (FIGS. 4A-4B), middle between second antinode and third node (FIGS. 5A-5B), and at the third node (FIGS. 6A-6B). The figures show the index and standing wave versus distance (e.g., FIGS. 4A, 5A, and 6A) and the power versus current of the modes (FIGS. 4B, 5B, and 6B) for the three designs that were tested. The data shows that the placement of each oxide region of the double oxide region configuration can determine the optical properties, such as increasing the number of modes.

Figure 4A:
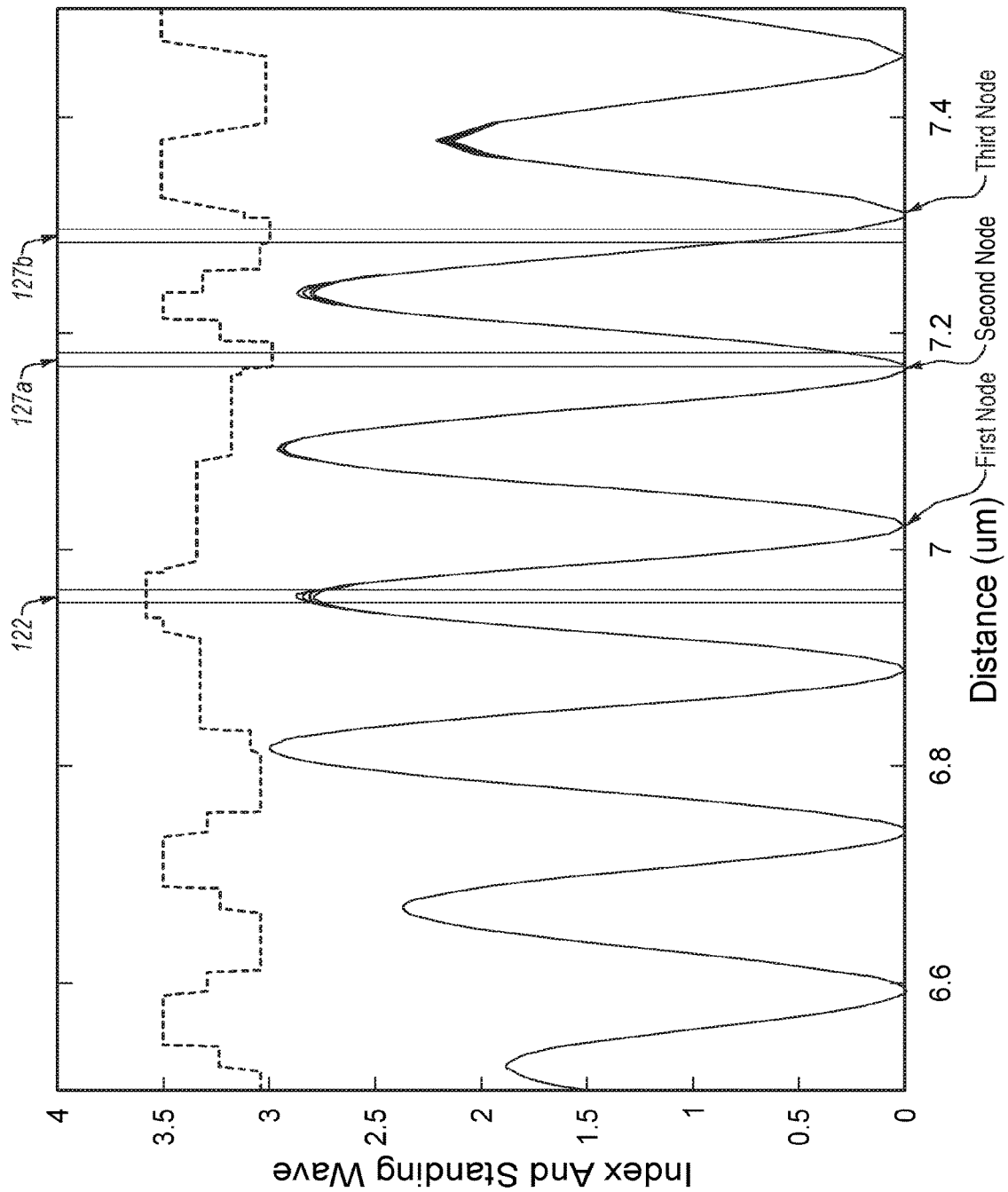
FIG. 4A includes a graph showing the index of refraction and standing wave versus distance for a VCSEL having a first oxide region at the second node and a second oxide region at the third node.
Figure 4B:
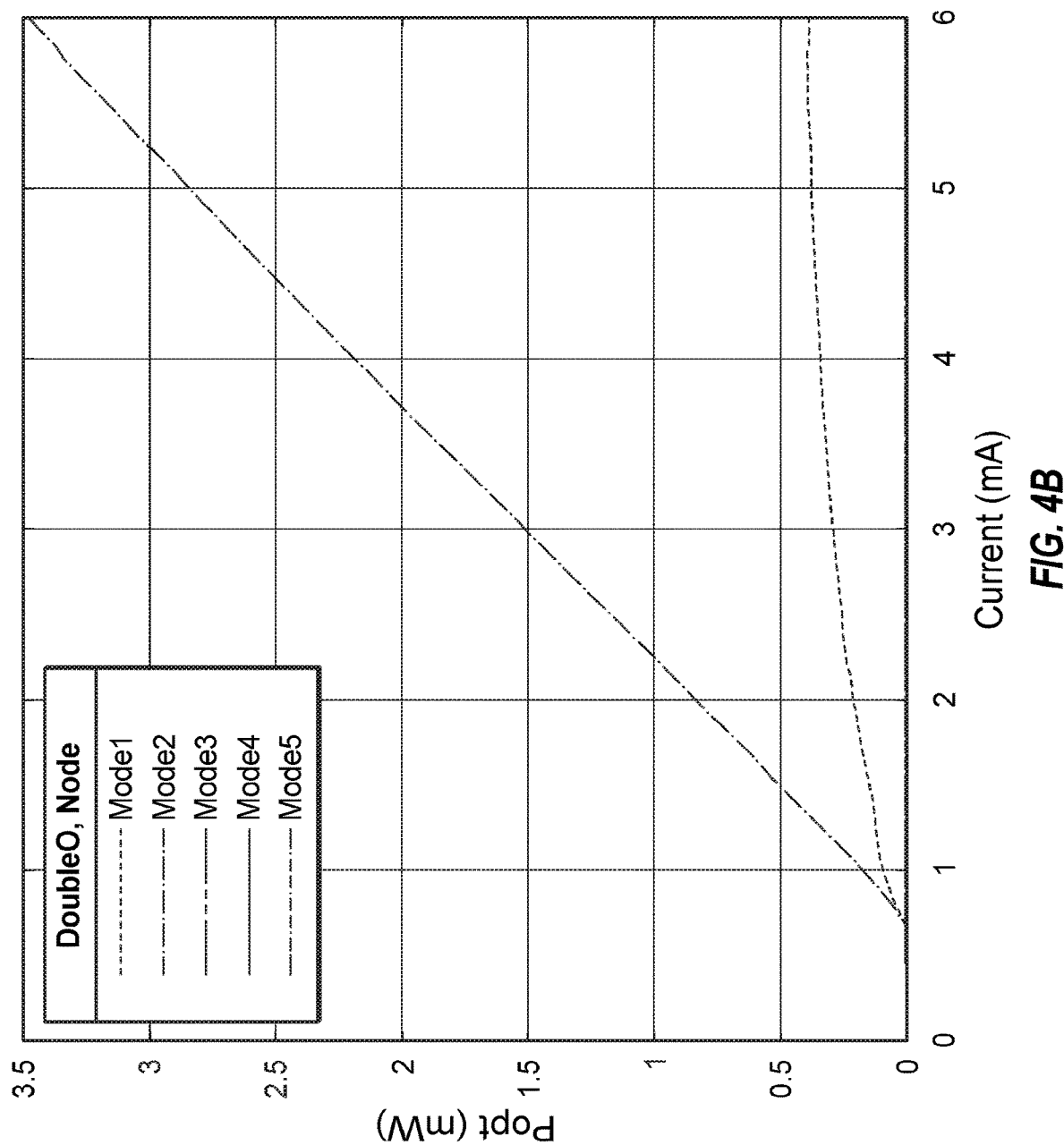
FIG. 4B includes a graph of the power versus current that shows the multi-modes for the VCSEL of FIG. 4A.

FIG. 4A shows the first oxide region 127a placed at the second node and the second oxide region 127b at the third node, which is shown relative to the active region 122. The spacing from the active region 122 to the first antinode is about 0.37 from the active region 122 to the first oxide region 127a (at the second node) is about 0.2 and from the active region 122 to the third antinode is about 0.415 The standing wave is consistent across the figures for the different embodiments (e.g., FIGS. 4A, 5A, and 6A), where the nodes are at the troughs and the antinodes are the peaks. FIGS. 5B and 6B show that the placement and spacing of the oxide regions can change the number of modes from single mode to a higher order multimode.

In some embodiments, the two oxide regions can be at positions from the first antinode to anywhere between the first antinode and the emission surface. That is, the first oxide region can be at least half-wave distance from the active region, which aligns with a peak of the standing wave. There is no oxide region less than a half-wave distance from the active region. The calculation to determine the minimum distance from the active region is $0.5*(\lambda)/(\text{effective index})$. In an example of a 940 nm VCSEL, the optical distance is a half-wave, or the physical distance is 0.137 microns. In some aspects, the optical distance can be 0.470 microns (half-wave ~0.137*3.4), where the effective index is about 3.4. As such, for a 940 nm VCSEL, the first oxide region must be at least 0.137 microns from the active region. The second oxide region can be at any position further away from the active region than the first oxide region, and the location can be determined by determining the desired optical beam property (e.g., divergence angle, multi-modes, etc.), and then selecting the appropriate location. A databank or a lookup table can include the optical property (e.g., divergence angle or numerical aperture) for a number of different double oxide regions placements, so that the placement can be selected to obtain the desired optical property, which can be done for each desirable wavelength of emitted light. In the above example, the second oxide region can be placed up to the third antinode, or even further in some instances. Accordingly, different wavelengths of emitted light can have the double oxide regions at different locations in order to obtain a desired divergence angle.

Figure 7A:
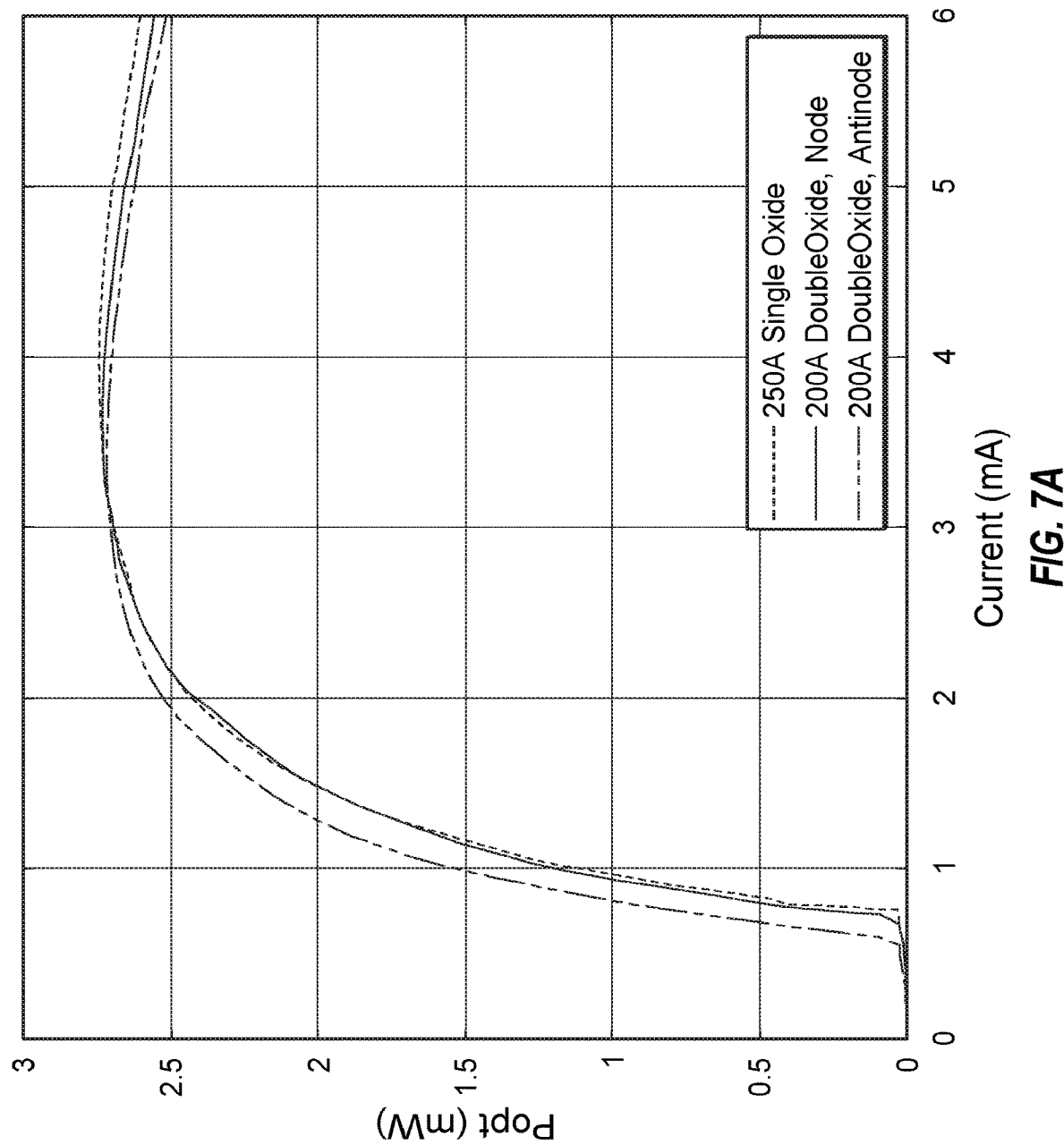
FIG. 7A includes a graph showing the WPE (wall-plug efficiency) versus current for angle for different VCSEL embodiments having a double oxide region structure.
Figure 7B:
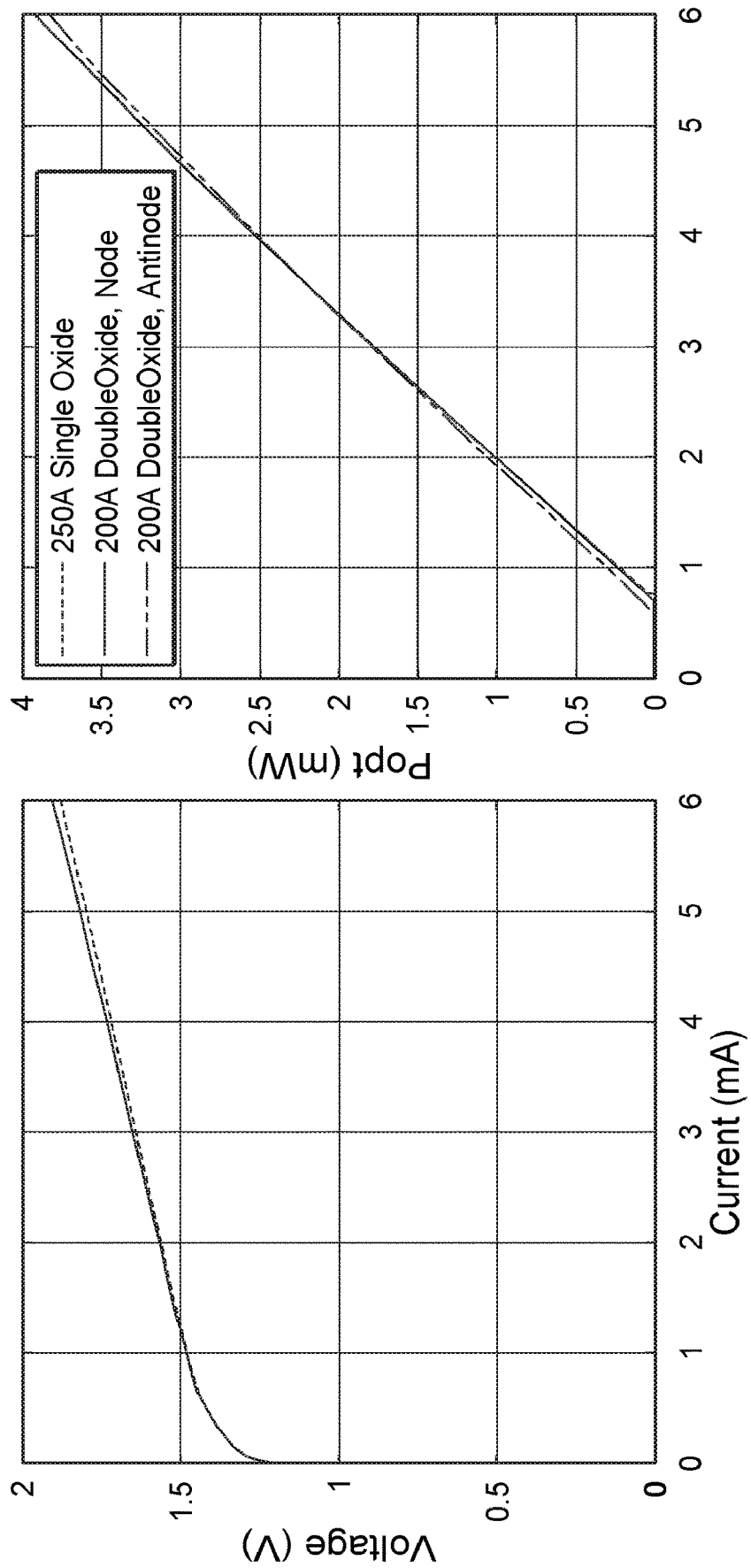
FIG. 7B includes graphs that show voltage (left) and power (right) versus current angle for different VCSEL embodiments having a double oxide region structure.

FIGS. 7A-7B include graphs that were generated for a double oxide region configuration with each oxide region having a thickness of 200 A located as a single oxide at the second node, a double oxide with a first oxide at the second node and a second oxide at the third node (DoubleOxide, node), and double oxide with first oxide at the second node and the second oxide at the antinode (DoubleOxide, antinode). The data in the graphs show that changing the thickness of the oxide region does not show an impact on the voltage, current, or WPE. These graphs can be compared to the 250 A embodiments in FIGS. 3C and 3D.

Figure 8A:
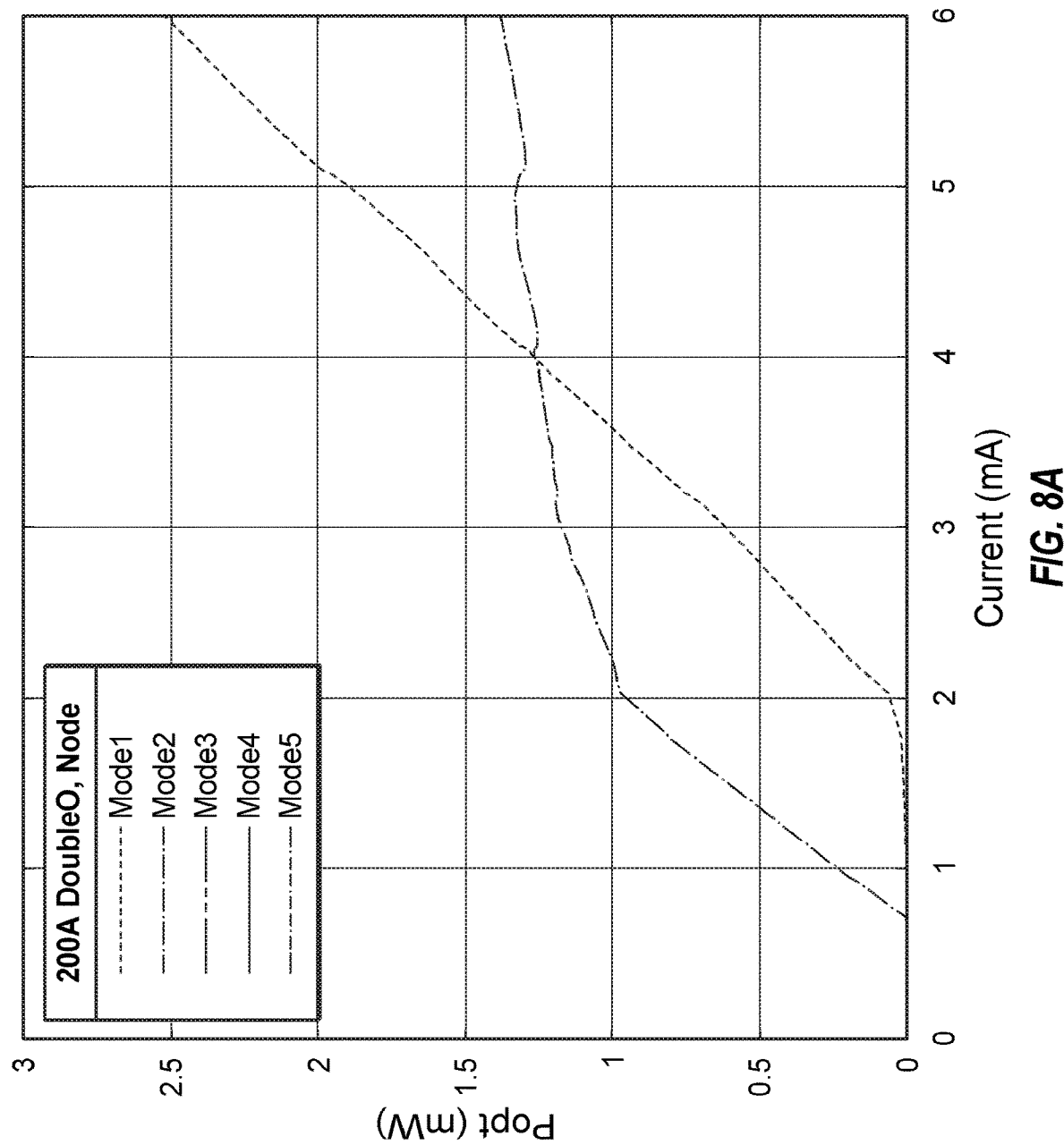
FIG. 8A includes a graph showing the power versus current that shows the multi-modes for the VCSEL having a first oxide region at the second node and a second oxide region at the third node with both oxide regions being 200 A thick.

FIG. 8A is a graph of the power versus current, which shows the different modes when the first oxide region (e.g., 200 A) is at the second node and the second oxide region (e.g., 200 A) at the third node. This shows the second mode increasing as the current increases.

Figure 8B:
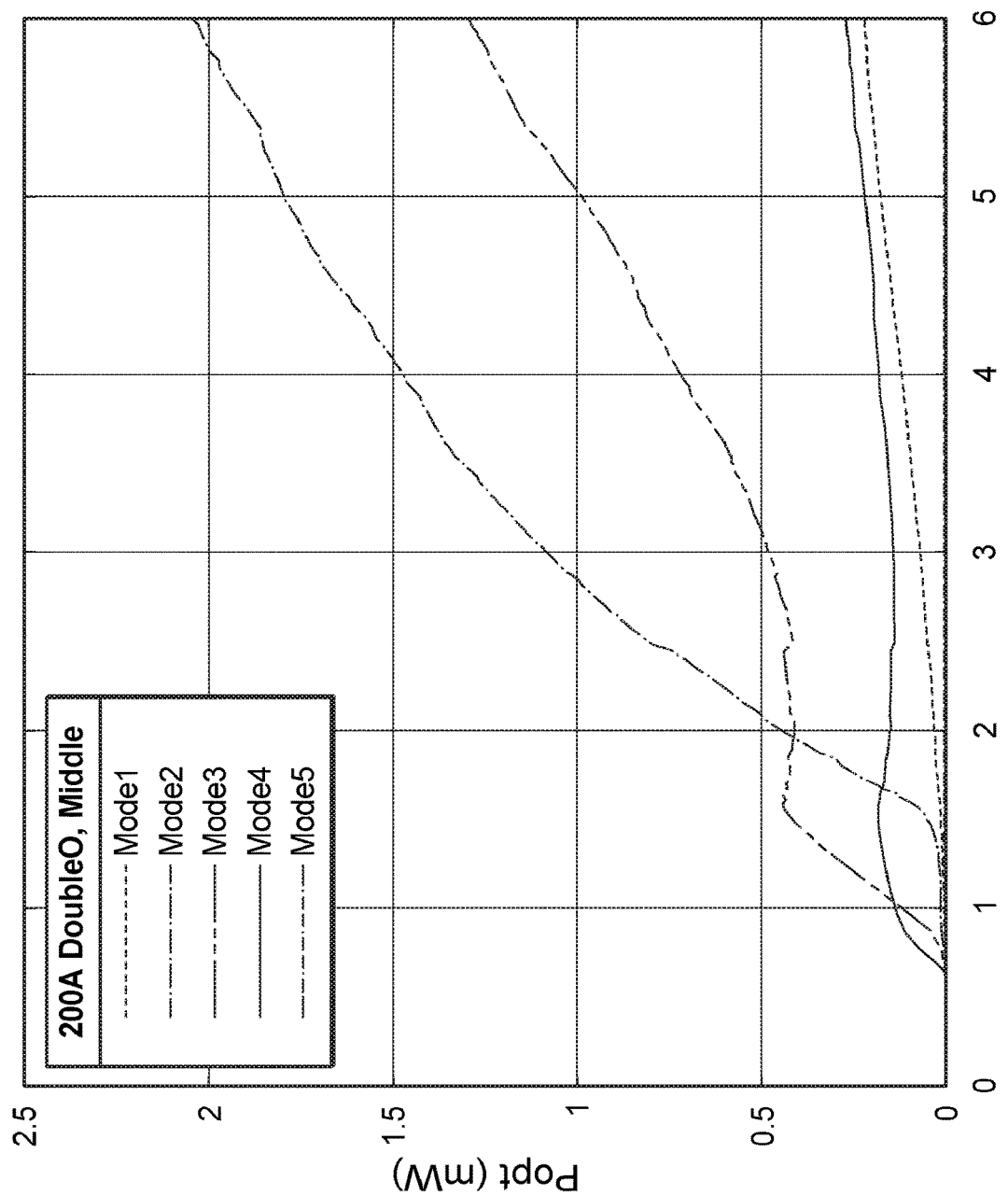
FIG. 8B includes a graph showing the power versus current that shows the multi-modes for the VCSEL having a first oxide region at the second node and a second oxide region at the middle between the second antinode and third node with both oxide regions being 200 A thick.

FIG. 8B is a graph of the power versus current, which shows the different modes when the first oxide region (e.g., 200 A) is at the second node and the second oxide region (e.g., 200 A) at the middle region between the second node and antinode. This shows the number of modes increasing as the current increases.

Figure 8C:
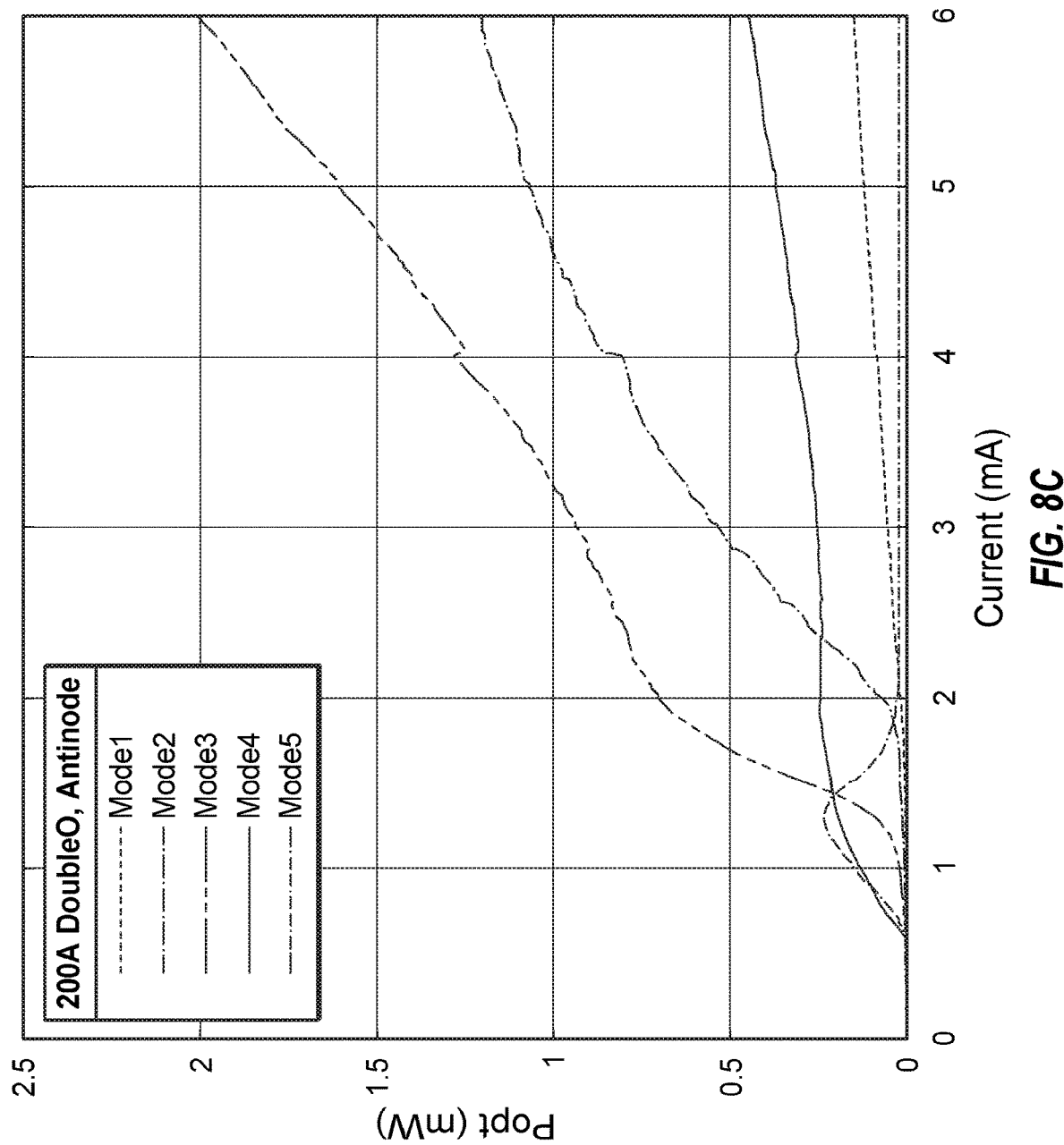
FIG. 8C includes a graph showing the power versus current that shows the multi-modes for the VCSEL having a first oxide region at the second node and a second oxide region at the second antinode with both oxide regions being 200 A thick.

FIG. 8C is a graph of the power versus current, which shows the different modes when the first oxide region (e.g., 200 A) is at the second node and the second oxide region (e.g., 200 A) at the antinode. This shows the number of modes increases as the current increases.

Figure 9A:
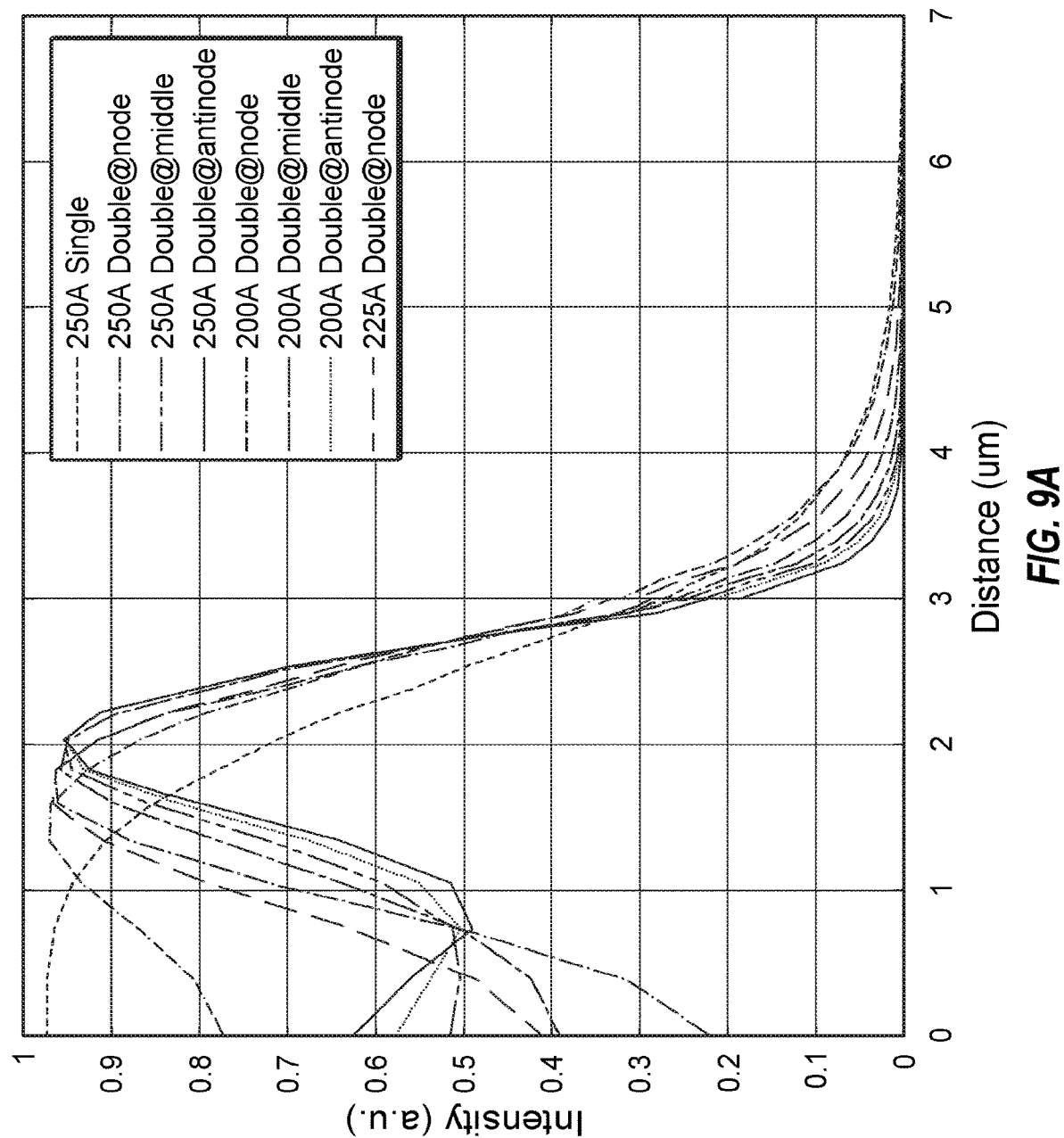
FIG. 9A includes a graph that shows near field data for the intensity versus distance for different VCSEL embodiments having a double oxide region structure.

FIG. 9A shows the intensity versus distance for the near field for a variety of embodiments of double oxide regions configurations and a single oxide embodiment. Similar to FIG. 3A, the double oxide regions show improvements. The outliers of the 250 A thick single oxide region at the node and the 200 A double oxide regions at the nodes, and the 225 A double oxide regions at the nodes. The legend in FIG. 9A shows the different embodiments as being: single oxide having a thickness of 250 A at the second node (250 A Single); double oxide having a thickness of 250 A with the first oxide region at the second node and the second oxide region at the third node (250 A Double@node); double oxide having a thickness of 200 A with the first oxide region at the second node and the second oxide region at the third node (200 A Double@node); double oxide having a thickness of 250 A with the first oxide region at the second node and the second oxide region at the middle (250 A Double@middle); double oxide having a thickness of 200 A with the first oxide region at the second node and the second oxide region at the middle (200 A Double@middle); double oxide having a thickness of 250 A with the first oxide region at the second node and the second oxide region at the antinode (250 A Double@antinode); double oxide having a thickness of 200 A with the first oxide region at the second node and the second oxide region at the antinode (200 A Double@antinode); and double oxide having a thickness of 225 A with the first oxide region at the second node and the second oxide region at the third node (225 A Double@node). In FIG. 9A, the nodes are relative to the standing wave, and thereby the second node is the second node of the standing wave. However, it should be recognized that the nodes may be defined as the nodes outside of the active region, and thereby the second node of the standing wave may be the first node outside of the active region, and correspondingly the "n" node may be the "n" node of the standing wave, but may be the "n−1" node outside of the active region when one node is in the active region.

Figure 9B:
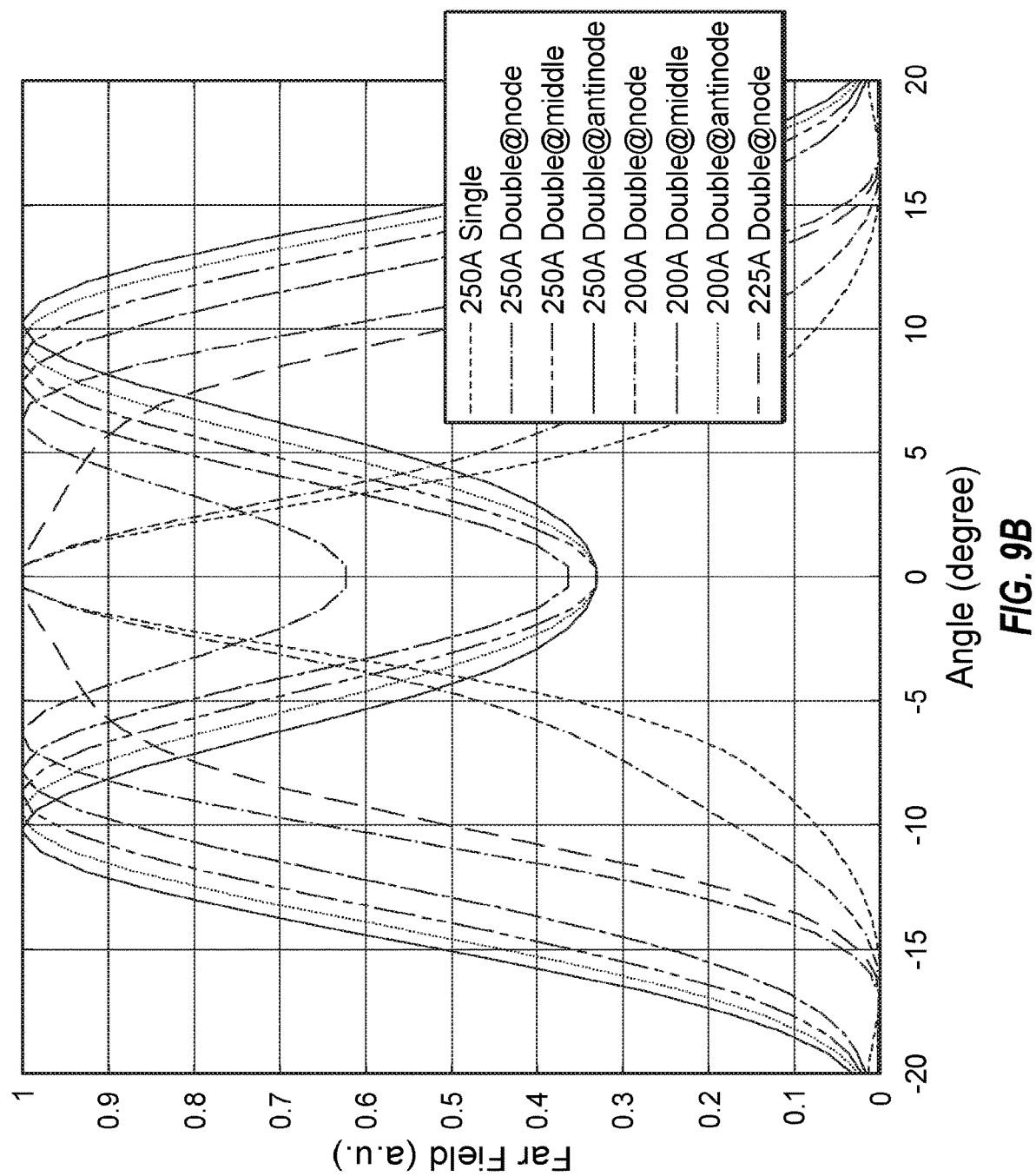
FIG. 9B includes a graph that shows the far field versus angle for different VCSEL embodiments having a double oxide region structure.

FIG. 9B shows the far field versus the divergence angle for the embodiments in FIG. 9A. FIG. 9B can be compared with FIG. 3B to show that the divergence angle can be modulated to obtain a desired value by changing location of the two oxide regions and the thickness of the oxide regions. Table 1 below shows the numerical aperture (NA, characterizes range of divergence angles of emitted light) and the W0 for each of the simulated embodiments, where the W0 is the beam radius at the beam waist. Now, it can be clear that the mode distribution and beam properties (e.g., NA and W0) can be tailored by changing the thickness of each oxide region as well as the location of each oxide region.

TABLE 1

| | Simulation | |
|---|---|---|
| Structure | NA | W0 (um) |
| Nominal Single Oxide 250A | 0.140 | 3.18 |
| DoubleOxide 200A, Node | 0.187 | 3.22 |
| DoubleOxide 200A, Middle | 0.280 | 2.92 |
| DoubleOxide 200A, Antinode | 0.303 | 2.86 |
| DoubleOxide 250A, Node | 0.234 | 2.98 |
| DoubleOxide 250A, Middle | 0.297 | 2.89 |
| DoubleOxide 250A, Antinode | 0.310 | 2.81 |
| DoubleOxide 225A, Node | 0.227 | 3.11 |

In one embodiment, the oxidized region is formed by selective oxidation, such as lateral oxidation or top down oxidation. The lateral oxidation can be applied to a shaped mesa or VCSEL body shape by oxidizing the semiconductor regions to form the aperture. The top down oxidation can be performed after the semiconductor region to be oxidized is formed by applying a shaped oxidation resistive covering and then oxidizing around the shaped oxidation resistive covering to sufficiently oxidize the lateral oxidized region.

In one embodiment, any type of chemical vapor deposition can be used to deposit the semiconductor material to be oxidized, then the oxidation is performed. The non-oxidized aperture is then etched into the oxidized region. The aperture is then filled with the semiconductor material to form the conductive aperture and lateral oxidized region. This process can be performed for both apertures in sequence during the build up of the epitaxial body. Each oxidized region may include a single layer as an oxidized layer or multiple oxidized layers, and/or a single layer aperture or multiple layers of central conducting material in the aperture.

In one embodiment, each of the two parts of the semiconductor region that is oxidized may be initially grown or deposited as one or more layers, optionally containing some aluminum, and then oxidized to form the apertures. In an InP based system, the aluminum content of an acceptable material for one or more layers to be oxidized may be about 52 percent. In the GaAs based system such acceptable material for oxidation would have about 97 to 98 percent of aluminum content. The GaAs based layer(s) may be relatively easy to oxidize. The oxidation of such layers may be done laterally along the side of the device via a trench around the semiconductor layers and/or with a mesa receiving the lateral oxidation. The process of lateral oxidation may be eased by intentional oxygen incorporation. The oxygen, a water vapor, or other fluid containing oxygen may be used as an oxidizing or diffusing agent that is inserted into the oxidizing environment and/or layer(s) to oxidize. The term "fluid" may be a generic term which includes liquids and gases as species. For instance, water, air, and steam may be fluids.

In one embodiment, the placement of the first oxidized regions may be at the node (e.g., second node) of the standing wave. The second oxidized region is placed apart from the first oxidized region so that the double oxide regions cause the desired divergence angle of the emitted optical signal.

In one embodiment, when designing and manufacturing an array of VCSELs, the desired divergence angle can be determined. As such, a higher divergence angle can be selected, and then the divergence angle can be evaluated to determine the desired double oxide characteristics in order for a suitable divergence angle for the emitted light.

Accordingly, a plot, table, or other form of data of the divergence angle versus spacing of the two oxide regions when one is at the second node and the other is between the antinode and the third node (e.g., at the middle between the antinode and third node) can be used in the determination of the parameters for the VCSELs, which can then be manufactured to obtain the array of VCSELs.

In one embodiment, a specific divergence angle, such as having a numerical aperture of at least 0.14, at least about 0.28, or at least about 0.30 or any therebetween can be selected. Then, a number of different spacings between the optical apertures can be prepared as test models or prototypes to determine the spacing between the two oxide layers that results in the desired divergence. The preferred separation distance (e.g., thickness of the non-oxidized region 152) can then be selected for manufacturing.

In one embodiment, a method of selecting dimensions for double oxide regions can be performed. The divergence angle or numerical aperture can be selected, and then the spacing between the oxide regions is obtained from the data, such as the tables and graphs herein. The spacing distance is then set and the thickness of each oxide aperture can be selected from the data, or vice versa. The area of each aperture and spacing between the oxide regions as well as the thickness of each oxide layer is determined from test data, which then defines the characteristics of the double oxide aperture to obtain the divergence angle or numerical aperture. Once the design of the dimensions of the double oxide regions are determined, the VCSEL is manufactured accordingly.

In one embodiment, a plurality of different sized areas for the aperture can be prepared based on the desired divergence angle or numerical aperture, and a plurality of spacing distances between the oxide regions can be prepared, each set having a plurality of variables. The double oxide aperture structures can be tested by computational simulation, or building and physical testing. The data can be generated to compare the variables to divergence in order to provide the tables or graphs for selecting the value for the spacing distance, the thickness of each oxide region, and the position of the second oxide region at the third node or antinode or therebetween or at a middle between a node and antinode, which is used to then prepare the VCSEL or array of VCSELs.

In one embodiment, a VCSEL can include a double oxide aperture in a double oxidized region that is located between an active region and an emission surface. In one aspect, the VCSEL includes an emission aperture at or proximal to the emission surface. In one aspect, the emission aperture has a cross-sectional profile which is the same as the aperture in the double oxidized region (e.g., double oxide aperture). In one aspect, the VCSEL includes at least a portion of a mirror stack between the two oxide apertures (e.g., region 152 can be a mirror stack, spacer, or other epitaxial region). In one aspect, the VCSEL includes at least a portion of a mirror stack between the two oxidized regions and the emission surface.

In one embodiment, each oxidized region includes a lateral oxidized region that is lateral of the oxide aperture. In one aspect, the lateral oxidized region can have a height that is the same as the height of the oxide aperture. In one aspect, the lateral oxidized region can be circular or elliptical and mirror the shape of the oxide aperture. In some aspects, the oxide region may not have a uniform thickness from oxide aperture to the outer perimeter edge, and thereby may be tapered to narrow between the aperture and perimeter edge (e.g., increasing or decreasing thickness), not uniform or other variations.

In some aspects, the VCSEL can be any VCSEL, such as a top emitter or bottom emitter that has the double oxide regions between the active region and the emission surface. Also, various VCSEL configurations can include the double oxide regions. In an example, the VCSEL can be a photonic crystal VCSEL.

In one embodiment, the VCSEL includes a contact having a contact aperture, the contact aperture being aligned with the double oxide aperture, and optionally aligned with the emission aperture. In one aspect, the contact bounds and/or defines the area of the emission aperture, or is +/−1%, 2%, 5%, 10%, or 25% thereof. In one aspect, the contact is C-shaped. In one aspect, the gap in the C-shaped contact is oriented toward a contact pad, or alternatively is oriented away from the contact pad or at any angle relative thereto. In one aspect, an electrical connector connects the contact to the contact pad.

In one embodiment, the VCSEL includes one or more trenches located around the oxidized region. In one aspect, the one or more trenches form one or more trenches in a shape of the aperture in the oxide region. In one aspect, each trench is lateral of the oxidized region.

In one embodiment, the VCSEL includes a mesa having the aperture and oxidized region. In one aspect, the active region is in the mesa, or it is in a base region under the mesa. In one aspect, the lateral oxidized region is bound by the mesa side surface, which may be vertical or sloped. In one aspect, the mesa includes the contact on the top mesa surface. In one aspect, the mesa includes the one or more trenches around the oxidized region. In one aspect, the mesa includes a contact pad that is electrically coupled through an electrical connector to the contact. In one aspect, the mesa is a macro mesa with a cross-sectional profile substantially larger than the oxidized region, or than the one or more trenches.

In one embodiment, a method of designing a VCSEL having a double aperture in a double oxidized region can be provided. The method can include performing a case study of a plurality of VCSELs having different double oxide characteristics such as different locations and spacing dimensions between the two oxidized layers, different oxide layers thickness, different oxide aperture cross-sectional profile and dimensions, and correlating the characteristics with a divergence angle or numerical aperture or other beam property for the emitted optical signal. Then, once a divergence angle or numerical aperture is known, it can be compared to the defined characteristics that provides the divergence angle or numerical aperture. Extrapolations and interpolations between data points, as well as simulations, can be used to obtain the desired divergence angle.

Each VCSEL of the case study may be a simulated VCSEL that is simulated for the case study or a physical VCSEL that is manufactured for the case study. Each VCSEL of the case study is assessed for an optical divergence angle. One or more VCSELS, such as an array of VCSELS or wafer/chip with VCSELs, can be manufactured with the selected divergence.

In one embodiment, a method of manufacturing is provided. The method of manufacturing may include obtaining specifications for the VCSEL, which specifications include the double oxide region characteristics for the divergence angle. The VCSEL is manufactured by preparing a plurality of semiconductor layers that define the features of the VCSEL, such as shown in the figures and/or described herein. The VCSEL can be manufactured to provide the bottom mirror, active region, and top mirror with or without any of the other features. A spacer region or lower portion of the top mirror adjacent to the active region may be oxidized to form the first oxide aperture defined by the lateral oxidized region, which is also used to form the second oxide aperture at a distance from the first oxide aperture.

In one embodiment, the VCSEL layers are formed and then one or more trenches in a shape are formed by etching. The etching can be performed as standard in the art with etch resistive templates being applied to the top of the VCSEL, such that etching is performed around the etch resistive templates. The etch resistive templates may define the one or more trenches, and optionally, the mesa. The etching may be performed with the etch resistive templates in place, and once etching is complete the etch resistive templates may be removed or additional layers may be deposited thereon. The etched VCSEL layers may then be subjected to selective oxidation in order to form the double oxide regions having the double oxide apertures. In one aspect, an oxidation resistive layer may be applied to the top of the VCSEL layers. In one aspect, an oxidation resistive layer/coating may be applied into the side walls of the one or more trenches so as to define an oxidation region that does not have any oxidation resistive layer. The oxidation is performed until the desired oxide aperture is formed within each oxidized region. The oxidation resistive layer may be removed or it may be included in the VCSEL. Optionally, one or more layers, such as the top mirror may be formed after the oxidation so as to be located above the oxidized region, whether the first oxidized region or second oxidized region. The contact can then be formed around an emission aperture, and where one or more of the contact pads may be formed. The metal of the contact may be connected to the contact pad with or without also covering one or more trenches (e.g., trapezoidal trenches) or a portion of a trench. A dielectric covering can then be applied to the top region of the VCSEL, and may cover the one or more trenches (e.g., fill the trenches), cover at least a portion of the contact, cover at least a portion of a top surface of the VCSEL layers, and either cover or form an emission surface over the aperture.

In one embodiment, the method of manufacture can include forming the VCSEL layers to include an oxidized or oxidizable layer (e.g., one or more discrete layers, such as deposition layers). Then, etching the aperture into the oxidized or oxidizable layer and then filling the aperture with a non-oxidizable or non-oxidized material (e.g., devoid of aluminum). This can be done sequentially for each oxidized region. Optionally, one or more trenches are etched, either along with etching the aperture or after the aperture is filled with the non-oxidizable material. The oxidizable layer is then oxidized to form the lateral oxidized region. The top layers, such as the top mirror may be formed before or after the oxidizing. Prior to oxidizing, a non-oxidizable layer/coating can be applied as an oxidation resistive template.

In one embodiment, a method of designing a VCSEL can include: preparing a plurality of VCSELs that each have an oxide aperture in an oxidized region that is located between an active region and an emission surface. In one aspect, the preparing includes manufacturing the plurality of physical VCSELs. In one aspect, the preparing includes digitally creating the plurality of VCSELs to be simulated and the operating includes simulating emission of light from the plurality of VCSELs.

In one aspect, the method can include recording and storing the identified location and thicknesses of the first oxide region, non-oxidized region, and second oxidized region on a non-transitory tangible medium. In one aspect, the method can include recording and storing the identified optical beam (e.g., laser) divergence angle into the non-transitory tangible medium so as to be linked with the identified characteristics of location, thickness and separation of the double oxide regions.

In one embodiment, a method of manufacturing a VCSEL can include: obtaining the divergence angle desired for the emitted optical beam that is caused by the double oxide regions; identifying identified characteristics of location, thickness and separation of the double oxide regions to cause the divergence angle; preparing a VCSEL stack of layers; oxidizing at least a portion of the VCSEL stack of layers to form the first oxide aperture within a lateral oxidized region; and oxidizing at least a second portion of the VCSEL stack of layers to form the second oxide aperture within a lateral oxidized region so as to have the double oxide aperture that causes the desired divergence angle of light emitted therefrom.

In some embodiments, the method may include providing an epitaxial structure, placing an oxidation resistant coating on sides of the epitaxial structure so as to define the first oxide region and second oxide region without the oxidation resistant coating, and oxidizing the epitaxial structure to form the first oxide region and the second oxide region.

Common to chemical etching, a mask can be used to define the etching part and non-etching part. A mask or other chemical blocking material can be placed on the blocking layer with apertures defining where the chemical etch will occur. In one example, MOCVD deposition is used to form the VCSEL layers. In one example, the non-etching region is defined by placing a layer of $SiO_2$ everywhere on the blocking layer except for leaving the one or more holes (circular, trapezoidal or other shape) for the region to be etched (e.g., trenches). Then the $SiO_2$ is removed.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for MOCVD can be > (greater than) 600° C. Additionally, the VCSELs can be prepared by methods that are similar to MBE, such as GSMBE (gas source MBE) and MOMBE (metalorganic MBE) or the like that can produce the regions as described.

It will be appreciated that other methods of manufacturing can be performed to form the embodiments of the VCSEL having the double oxide regions that is described herein.

In one embodiment, a double oxide region VCSEL can include: a first oxide aperture in a first oxidized region that is located between an active region and an emission surface at a node of the standing wave; a second oxide aperture in a second oxidized region that is between the first oxidized region and the emission surface at a different node, middle between node and antinode, or any position between any of the second node, middle between second node and antinode, and antinode; and a non-oxidized epitaxial region between the first oxide region and the second oxide region, wherein a combination of the first oxide aperture and second oxide aperture diverge an emitted laser beam at an divergence angle with a numerical aperture between about 0.14 and about 0.31. In some aspects, the first oxidized region is at the second node or not at a node.

In one embodiment, a double oxide layer VCSEL can include: a first oxide aperture in a first oxidized region that is located between an active region and an emission surface at the second node of the standing wave; a second oxide aperture in a second oxidized region that is between the first oxidized region and the emission surface at a third node, middle between second node and antinode, antinode, or any position between any of the second node, middle between third node and second antinode, second antinode; and a non-oxidized epitaxial region between the first oxide region and the second oxide region. In some aspects, a combination of the first oxide aperture and second oxide aperture diverges an emitted laser beam at an angle greater than when a single oxide aperture at the position of the first oxide aperture or a single oxide aperture at the position of the second oxide aperture. In some aspects, each oxide aperture can have a cross-sectional profile that is circular to elliptical. In some aspects, each oxide aperture can have a unique cross-sectional profile compared to the other oxide apertures. In some aspects, each oxide aperture can include the same cross-sectional profile as the other oxide apertures. In some aspects, there is no third oxide aperture. In some aspects, there are only two oxide apertures in the VCSEL. In other aspects, the VCSEL can include three or more distinct oxide regions with oxide apertures that are separated from each other. In these embodiments, the two adjacent oxide apertures can include the locations described herein.

In one aspect, the VCSEL can include an emission aperture having the same dimensions of the oxide aperture. In one aspect, the VCSEL can include a contact having a contact aperture therein, the contact being around the emission aperture. In one aspect, the contact is C-shaped. In one aspect, the VCSEL can include a mesa having the double oxide apertures in the double oxidized regions, an emission aperture, a contact, and a non-oxidized region between each oxidized region. In one aspect, the VCSEL can include a contact pad and an electrical connector that electrically connects the contact pad with the contact. In one embodiment, a plurality of VCSELs is provided on a chip in an array.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B." The present invention may be embodied in other specific forms without departing from its spirit or essential characteristics.

The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A vertical cavity surface emitting laser (VCSEL) comprising:
    an active region configured to produce light at a wavelength;
    a first oxide region having a first thickness and spaced apart from the active region by a distance of at least one-half of the wavelength, wherein the first oxide region is located at a second node of a standing wave counted as extending away from the active region;
    a top mirror formed over the first oxide region, wherein the first oxide region being between the active region and the top mirror; and
    a second oxide region having a second thickness and disposed adjacent to the first oxide region, wherein the first oxide region is between the active region and the second oxide region,
    wherein the light has a divergence angle based upon the first thickness of the first oxide region and the second thickness of the second oxide region.

2. The VCSEL of claim 1, comprising a first aperture in the first oxide region and a second aperture in the second oxide region, wherein the first aperture and the second aperture has a higher conductivity than the respective first oxide region and second oxide region.

3. The VCSEL of claim 2, wherein at least one of the first aperture and the second aperture comprises one of a circular cross-sectional profile and an elliptical cross-sectional profile.

4. The VCSEL of claim 1, wherein the first oxide region and the second oxide region result in a numerical aperture range between 0.14 and 0.31.

5. The VCSEL of claim 1, wherein the second oxide region is between the first oxide region and an emission surface.

6. The VCSEL of claim 1, comprising a non-oxidized epitaxial region between the first oxide region and the second oxide region.

7. The VCSEL of claim 1, comprising a first confining layer located at a first side of the active region and a second confining layer located between the active region and the second oxide region.

8. A system comprising:
an array of a plurality of the VCSEL of claim 1.

9. The system of claim 8, wherein each VCSEL comprises aa different divergence angle based upon the respective first thickness of the first oxide region and the second thickness of the second oxide region.

10. The system of claim 2, wherein the second aperture is aligned with the first aperture and the first aperture and the second aperture include a material that has different optical qualities than both the first oxide region and the second oxide region.

11. The system of claim 1, wherein the second oxide region comprises a second aperture located at a position between a node of the standing wave and an antinode of the standing wave.

12. The system of claim 10, wherein the first oxide region and the second oxide region of the plurality of VCSELS each result in a respective numerical aperture range between 0.14 and 0.31.

13. The system of claim 9, wherein each VCSEL comprises a non-oxidized epitaxial region between the first oxide region and the second oxide region.

14. The system of claim 9, wherein each VCSEL comprises a first confining layer located at a first side of the active region and a second confining layer located between the active region and the second oxide region.

15. The system of claim 8, wherein each VCSEL comprises a second oxide region disposed adjacent to the first oxide region, and
wherein the first oxide region includes a first aperture and the second oxide region includes a second aperture aligned with the first aperture.

16. The system of claim 15, wherein at least one of the first aperture and the second aperture comprises one of a circular cross-sectional profile and an elliptical cross-sectional profile.

17. The system of claim 15, wherein each VCSEL comprises a third oxide region having a third aperture aligned with at least one of the first aperture and the second aperture.

18. The VCSEL of claim 1, wherein the second oxide region comprises a second aperture located at a node of the standing wave.

19. The VCSEL of claim 1, wherein the second oxide region comprises a second aperture located between a node and antinode of the standing wave.

20. The VCSEL of claim 1, wherein at least one of the first oxide region and the second oxide region is disposed within the top mirror.

21. The VCSEL of claim 1, wherein the second oxide region comprises a second aperture located at a middle position between an antinode and a node of the standing wave.

* * * * *